United States Patent
Tanaka et al.

(10) Patent No.: US 7,964,532 B2
(45) Date of Patent: Jun. 21, 2011

(54) RE123-BASED OXIDE SUPERCONDUCTOR AND METHOD OF PRODUCTION OF SAME

(75) Inventors: Shoji Tanaka, Tokyo (JP); Naomichi Sakai, Tokyo (JP); Takato Machi, Tokyo (JP); Muralidhar Miryala, Tokyo (JP)

(73) Assignee: International Superconductivity Technology Center, The Juridical Foundation, Tokyo (JP)

( * ) Notice: Subject to any disclaimer, the term of this patent is extended or adjusted under 35 U.S.C. 154(b) by 917 days.

(21) Appl. No.: 11/887,334

(22) PCT Filed: Mar. 31, 2006

(86) PCT No.: PCT/JP2006/307415
§ 371 (c)(1),
(2), (4) Date: Sep. 28, 2007

(87) PCT Pub. No.: WO2006/104287
PCT Pub. Date: Oct. 5, 2006

(65) Prior Publication Data
US 2009/0270260 A1    Oct. 29, 2009

(30) Foreign Application Priority Data

Mar. 31, 2005   (JP) ................................. 2005-104866
Oct. 14, 2005   (JP) ................................. 2005-300766

(51) Int. Cl.
*H01B 12/00* (2006.01)
*H01B 13/00* (2006.01)
*H01L 39/24* (2006.01)

(52) U.S. Cl. ........ 505/450; 505/470; 505/500; 505/430; 505/704; 505/451; 427/62; 427/374.4; 427/435; 29/599

(58) Field of Classification Search .................. 505/150, 505/450, 452, 425, 235–238, 230; 428/698–701, 428/930; 427/62, 430.1, 435, 374.4
See application file for complete search history.

(56) References Cited

U.S. PATENT DOCUMENTS 5,958,840 A * 9/1999 Kohayashi et al. ........... 505/124
6,172,009 B1   1/2001 Smith et al.
6,610,428 B2   8/2003 Smith et al.
(Continued)

FOREIGN PATENT DOCUMENTS

JP       1-320710       12/1989
(Continued)

OTHER PUBLICATIONS

Yutaka Yamada et al., "Critical Current Density of Wire Type Y-Ba-Cu Oxide Superconductor", vol. 26, No. 5, pp. L865-L866, (May 1987).

(Continued)

*Primary Examiner* — Stanley Silverman
*Assistant Examiner* — Kallambella Vijayakumar
(74) *Attorney, Agent, or Firm* — Wenderoth, Lind & Ponack, L.L.P.

(57) ABSTRACT

An RE123-based oxide superconductor characterized by comprising a conductive layer containing an $REBa_2Cu_3O_{7-\delta}$-based oxide superconductor formed using a mixed material of at least $RE_2BaO_4$ and a $Ba_x$—$Cu_y$—$O_z$-based material and a holding member which holds said conductive layer, where, RE is one type or more of elements selected from La, Nd, Sm, Eu, Gd, Dy, Ho, Er, Tm, Yb, Lu, and Y.

6 Claims, 14 Drawing Sheets

(a)

(b)

U.S. PATENT DOCUMENTS

2002/0182451 A1    12/2002    Smith et al.
2007/0128735 A1*    6/2007    Sakai et al. ................ 438/2

FOREIGN PATENT DOCUMENTS

| | | |
|---|---|---|
| JP | 3-138820 | 6/1991 |
| JP | 05-282932 | * 10/1993 |
| JP | 2002-505032 | 2/2002 |
| JP | 2003-020225 | * 1/2003 |
| JP | 2003-20225 | 1/2003 |
| JP | 2006-36574 | 2/2006 |
| WO | WO 2006-011389 | * 2/2006 |

OTHER PUBLICATIONS

T. Fujita et al., "Advances in Superconductivity VI", vol. 2, pp. 749-754, (Oct. 1993).

* cited by examiner

100 μm

10 μm

Fig.11
(a)
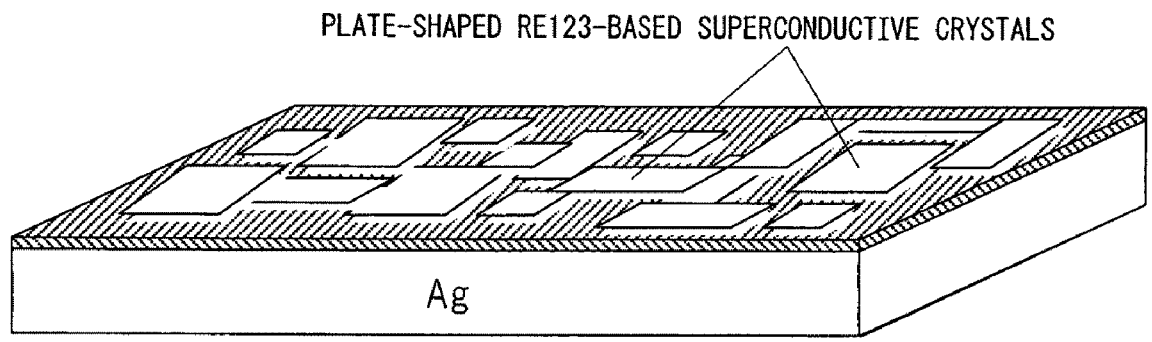
(b)
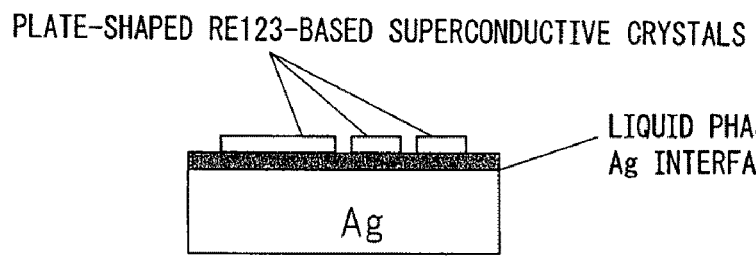

RE123-BASED OXIDE SUPERCONDUCTOR AND METHOD OF PRODUCTION OF SAME

TECHNICAL FIELD

The present invention relates to an RE123-based oxide superconductor and a method of production of the same.

BACKGROUND ART

Compared to $Nb_3Sn$ and other metal superconductor materials, Bi-based and Y-based oxide superconductor materials have a higher critical temperature ($T_c$), so applications as wires for electromagnets and power transmission are greatly anticipated.

Bi-based oxide superconductor materials are already in the commercialization stage (see Japanese Patent Publication (A) No. 3-138820), but when applying a magnetic field in parallel to the c-axis, the irreversible magnetic field ($B_{irr}$) at 77K (cooling temperature by liquid nitrogen) is a low 0.5 T or less, so even when formed into wire, the applications end up being limited.

On the other hand, compared with Bi-based oxide superconductor materials, a superconductor material mainly comprised of an $REBa_2Cu_3O_{7-\delta}$-based oxide (hereinafter referred to as a "RE123-based oxide superconductor") has a higher critical current density ($J_c$) and irreversible magnetic field ($B_{irr}$), so application as a wire for a strong magnetic field and a strand for cable for transmission of high voltages are greatly anticipated.

However, in the case of an RE123-based oxide superconductor material, oriented crystals can be obtained by the (i) melt growth method, but the heat treatment temperature is a high 1000° C. or more. The Ag sheath materials conventionally used for fabrication of wire (melting point of Ag: approximately 960° C.) cannot be used. Further, with (ii) rolling or other mechanical techniques, the crystals do not orient, the grain boundary bonds are weak, a high current density cannot be obtained, etc., so even if making a wire using an Ag sheath material by the PIT method (powder in tube method), the desired current characteristics could not be obtained (see *Jpn. J. Appl. Phys.*, Vol. 26, No. 5 (1987) pp. L865 to L866).

Consequently, as methods for forming a wire using a metal base material, the coating and heat decomposition method, physical vapor deposition method, etc. providing an orienting intermediate layer on the metal base material and forming an orienting superconductive film over that have been developed (see Japanese Patent Application No. 11-504767 [Japanese Patent Publication (A) No. 2002-505032] and *Adv. Superconductivity VI* (1994) pp. 749-754). However, these methods are slow in the film forming rate and therefore have problems in terms of mass productivity.

In this way, in the development of long RE123-based oxide superconducting wire stably providing superior superconducting characteristics (high critical current density and high irreversible magnetic field) or RE123-based oxide superconductors forming the basic material for wires, there are still many problems which remain to be solved, but the development of the above RE123-based oxide superconducting wire would have extremely great merits not only from the viewpoint of utilization as wire for a strong magnetic field or strands of a cable for high voltage transmission, but also from the viewpoint of resource and energy saving. Presently, Japan, the U.S., and Europe are fiercely competing for the development of technology for improving superconducting characteristics and mass producing RE123-based oxide superconducting wire able to easily handle even multi-core applications.

DISCLOSURE OF THE INVENTION

The present invention, based on the merits of developing a RE123-based oxide superconducting wire having superior superconducting characteristics (high critical current density and high irreversible magnetic field), has as its object the provision of a long RE123-based oxide superconductor stably provided with superior superconducting characteristics at a liquid nitrogen temperature and able to be used as a strand of a single core or multi-core wire and a method of production able to mass produce that superconductor.

The applicants proposed a novel fabrication method (UING method) which fabricates a RE123-based oxide superconductor in Japanese Patent Application No. 2004-217594. According to this method, it is possible to fabricate a RE123-based oxide superconductor (bulk) at a temperature lower than the heat treatment temperature in the conventional melt growth method.

Consequently, the present inventors took note of the lower temperatures of heat treatment and investigated in detail the reaction of a RE-Ba—O-based component (solid phase component) and Ba—Cu—O-based component (component forming the liquid phase [hereinafter simply referred to as the "liquid phase component"]) using the differential thermal analysis method down to the low temperature region.

As a result, they discovered that in a mixed system of an RE-Ba—O-based component (solid phase component) and a Ba—Cu—O-based component (liquid phase component), a RE123-based oxide superconductor can be produced through the intervention of the liquid phase and a novel solid phase-liquid phase reaction enabling the fabrication of a RE123-based oxide superconductor superior in crystal orientation and superior in superconducting characteristics at a lower temperature.

FIG. 1 schematically shows differential thermal analysis curves according to the conventional method and the solid phase-liquid phase reaction. FIG. 1(a) shows the thermal analysis curve when heating and raising in temperature a $REBa_2Cu_3O_{7-\delta}$ powder in accordance with the conventional method. There is a downward peak (endothermic peak) P' in the curve at the high temperature region. This shows that $REBa_2Cu_3O_{7-\delta}$ powder dissolves and absorbs heat. This dissolving and heat absorption temperature rises along with an increase of the ion radius of the RE, but is usually around 1000° C.

On the other hand, FIG. 1(b) shows a thermal analysis curve when mixing, heating, and raising the temperature of $RE_2BaO_4$ (solid phase component, indicated in the figure as RE210) and a $Ba_x$—$Cu_y$—$O_z$-based material (liquid phase component, indicated in the figure as Ba—Cu—O).

Two endothermic peaks $P_1$ and $P_2$ appear in the process of the temperature rise. If comparing these against X-ray diffraction data of samples rapidly cooled from a high temperature, the following was learned.

(w) The endothermic peak $P_1$ shows that the $Ba_x$—$Cu_y$—$O_z$-based material (liquid phase component) begins to dissolve at the temperature where the endothermic peak starts to appear, that is, the temperature where the endothermic reaction starts to occur (hereinafter referred to as the "$P_1$ temperature") and the RE123-based oxide (indicated in the figure as the "123 phase") are formed through the liquid phase at the $P_1$ temperature or more.

(x) The endothermic peak $P_2$ shows that the above formed RE123-based oxide (indicated in the figure as the "123 phase") starts to break down and melt at the temperature where the endothermic peak starts to appear, specifically, the temperature where the endothermic reaction starts to occur (hereinafter referred to as the "$P_2$ temperature").

Then, furthermore, as shown in FIG. 1(b) as the "(Z) high orientation polycrystalline structure" region corresponding to the temperature region between the $P_1$ temperature and the $P_2$ temperature, it was learned that (y) due to the solid phase-liquid phase reaction in the above temperature region, a plate-shaped RE123-based oxide superconductor superior in crystal orientation and uniform in superconducting characteristics is produced.

In this way, the inventors discovered a novel solid phase-liquid phase reaction characterized by the above (w), (x), and (y) by differential thermal analysis according to the reaction of a mixed system of $RE_2BaO_4$ (solid phase component) and a $Ba_x$—$Cu_y$—$O_z$-based material (liquid phase component) and differing from the UING method in the point of the process of formation of the RE123-based oxide.

Further, the present invention is based on the above novel solid phase-liquid phase reaction.

Note that, as shown in FIG. 1(b), at the low temperature side from the $P_1$ temperature, a nonoriented RE123-based oxide is produced by a solid phase-solid phase reaction. Further, at the high temperature side from the $P_2$ temperature, the RE123 phase decomposes, so the melt growth method using seed crystals (method of fabricating crystals by gradual cooling etc. after melting) can be used to grow crystals of high orientation RE123-based oxide.

Next, the inventors took note of the endothermic peak $P_1$ in the solid phase-liquid phase reaction shown in FIG. 1(b), came up with the idea that if it were possible to lower the $P_1$ temperature (low temperature liquid phase generation temperature) to the lower temperature side, for example, down to a temperature of the melting point of Ag (approximately 960° C.) or less, it would be possible to eliminate one of the reasons obstructing the mass production of RE123-based oxide superconducting wire, that is, that "the heat treatment temperature in the melt growth method (the melting temperature of RE123-based oxide) is a high 1000° C. or more and an Ag sheath material used for wire fabrication in the past (melting point of Ag: approximately 960° C.) cannot be used", and engaged in intensive studies on the factors affecting the $P_1$ temperature and the effects of the same.

As a result, the inventors discovered that in the novel solid phase-liquid phase reaction forming the basis of the present invention, by one or more of (z1) reducing the grain size of the powder material, (z2) lowering the oxygen partial pressure of the reaction atmosphere, and (z3) adding a required amount of Ag to the powder material, in FIG. 1(b), it is possible to lower the $P_1$ temperature to a temperature of the melting point of Ag (approximately 960° C.) or less.

These discoveries are discoveries forming the basis of the present invention, so will be described in detail later.

That is, the inventors discovered that, in FIG. 1(b), in the temperature region between the $P_1$ temperature and the $P_2$ temperature, which temperature region being the melting point of Ag (approximately 960° C.) or less, it is possible to react $RE_2BaO_4$ (solid phase) and a $Ba_x$—$Cu_y$—$O_z$-based material (liquid phase) and form on an Ag base material a plate-shaped RE123-based oxide superconductor superior in crystal orientation and superconducting characteristics.

Further, the inventors confirmed that it is possible to make an RE123-based oxide superconductor, formed integrally with an Ag tube or other base material by the above solid phase-liquid phase reaction, into a wire and further possible to produce wire of a multi-core structure.

The present invention was made based on the above discoveries and has as its gist the following:

(1) An RE123-based oxide superconductor characterized by comprising a conductive layer containing an $REBa_2Cu_3O_{7-\delta}$-based oxide superconductor formed using a mixed material of at least $RE_2BaO_4$ and a $Ba_x$—$Cu_y$—$O_z$-based material and a holding member which holds said conductive layer, where, RE is one type or more of elements selected from La, Nd, Sm, Eu, Gd, Dy, Ho, Er, Tm, Yb, Lu, and Y.

(2) An RE123-based oxide superconductor according to (1) characterized in that said $Ba_x$—$Cu_y$—$O_z$-based material is a metal oxide and/or its compounds mixed together.

(3) An RE123-based oxide superconductor according to (1) or (2) characterized in that said x, y, and z satisfy $2x \leq y \leq 2.2x$ and $z = x + y$.

(4) An RE123-based oxide superconductor according to any one of (1) to (3) characterized in that said mixed material contains 15 mass % or less of Ag or an Ag oxide.

(5) An RE123-based oxide superconductor according to any one of (1) to (4) characterized in that said $REBa_2Cu_3O_{7-\delta}$-based oxide superconductor includes a non-superconducting phase dispersed inside it.

(6) An RE123-based oxide superconductor according to any one of (1) to (5) characterized in that said holding member is a long one and contacts the conductive layer at part or all of its circumference in a cross-section vertical to the longitudinal direction.

(7) An RE123-based oxide superconductor according to any one of (1) to (6) characterized in that said holding member is comprised of a metal material.

(8) An RE123-based oxide superconductor according to (7) characterized in that said metal material is a metal material not reacting with a chemically active liquid phase and permeable to oxygen.

(9) An RE123-based oxide superconductor according to (7) or (8) characterized in that said metal material is coated by an intermediate layer containing a material not reacting with a chemically active liquid phase.

(10) A method of production of an RE123-based oxide superconductor characterized by (a) bringing part of a mixed material in which at least $RE_2BaO_4$ and a $Ba_x$—$Cu_y$—$O_z$-based material are mixed into contact with a holding member, then (b) heating this in an atmosphere containing oxygen together with the holding member to a temperature of the dissolution temperature of the $Ba_x$—$Cu_y$—$O_z$-based material or more to form a conductive layer containing an $REBa_2Cu_3O_{7-\delta}$-based oxide superconductor, where, RE is one type or more of elements selected from La, Nd, Sm, Eu, Gd, Dy, Ho, Er, Tm, Yb, Lu, and Y.

(11) A method of production of an RE123-based oxide superconductor characterized by (a) bringing part of a mixed material in which at least $RE_2BaO_4$ and a $Ba_x$—$Cu_y$—$O_z$-based material are mixed into contact with a holding member, then (b) drawing this one time or more, then (c) heating this in an atmosphere containing oxygen together with the holding member to a temperature of the dissolution temperature of the $Ba_x$—$Cu_y$—$O_z$-based material or more to form a conductive layer containing an $REBa_2Cu_3O_{7-\delta}$-based oxide superconductor, where, RE is one type or more of elements selected from La, Nd, Sm, Eu, Gd, Dy, Ho, Er, Tm, Yb, Lu, and Y.

(12) A method of production of an RE123-based oxide superconductor according to (11) characterized by repeating the treatments of (b) and (c) to form a conductive layer containing an REBa$_2$Cu$_3$O$_{7-\delta}$-based oxide superconductor having a more superior crystal orientation.

(13) A method of production of an RE123-based oxide superconductor characterized by (a) bringing part of a mixed material in which at least RE$_2$BaO$_4$ and a Ba$_x$—Cu$_y$—O$_z$-based material are mixed into contact with a holding member, then (b) heating this in an atmosphere containing oxygen together with the holding member to a temperature of the dissolution temperature of the Ba$_x$—Cu$_y$—O$_z$-based material or more and drawing this one time or more to form a conductive layer containing an REBa$_2$Cu$_3$O$_{7-\delta}$-based oxide superconductor, where, RE is one type or more of elements selected from La, Nd, Sm, Eu, Gd, Dy, Ho, Er, Tm, Yb, Lu, and Y.

(14) A method of production of an RE123-based oxide superconductor according to (13) characterized by repeating (b) to form a conductive layer containing an REBa$_2$Cu$_3$O$_{7-\delta}$-based oxide superconductor having a more superior crystal orientation.

(15) A method of production of an RE123-based oxide superconductor according to any one of (10) to (14) characterized by, when forming said conductive layer containing a REBa$_2$Cu$_3$O$_{7-\delta}$-based oxide superconductor, performing heat treatment heating to a temperature of the dissolution temperature of the Ba$_x$—Cu$_y$—O$_z$-based material or more, then heating to a temperature lower than that temperature at least one time.

(16) A method of production of an RE123-based oxide superconductor according to any one of (10) to (15) characterized by reducing a grain size of said mixed material to less than 1 μm and lowering a dissolution temperature of said Ba$_x$—Cu$_y$—O$_z$-based material more.

(17) A method of production of an RE123-based oxide superconductor according to any one of (10) to (16) characterized by reducing an oxygen partial pressure in said atmosphere containing oxygen to 0.02 MPa or less and lowering a dissolution temperature of said Ba$_x$—Cu$_y$—O$_z$-based material more.

(18) A method of production of an RE123-based oxide superconductor according to any one of (10) to (17) characterized by adding 15 mass % or less of Ag or an Ag oxide to said mixed material and lowering a dissolution temperature of said Ba$_x$—Cu$_y$—O$_z$-based material more.

(19) A method of production of an RE123-based oxide superconductor according to any one of (11) to (18) characterized by pressurizing said RE123-based oxide superconductor at an isotropic pressure of 10 MPa or more, then heat treating it.

(20) A method of production of an RE123-based oxide superconductor according to any one of (11) to (18) characterized by pressurizing said RE123-based oxide superconductor at an isotropic pressure of 0.5 MPa or more.

According to the present invention, it is possible to provide a long RE123-based oxide superconductor stably provided with superior superconducting characteristics and able to be used as a strand of a single core or multi-core wire.

BRIEF DESCRIPTION OF THE DRAWINGS

FIG. 11 is a view showing a mode by which crystals of the RE123-based superconductor are formed in plate shapes and oriented on an Ag base material. (a) is a view showing the overall growth mode and (b) is a view showing a cross-section of the same.

BEST MODE FOR CARRYING OUT THE INVENTION

1) Solid Phase-Liquid Phase Reaction

First, the solid phase ($RE_2BaO_4$)-liquid phase ($Ba_x$—$Cu_y$—$O_z$-based material) reaction forming the basis of the present invention will be explained. Note that "RE" is 1 or more types of elements selected from La, Nd, Sm, Eu, Gd, Dy, Ho, Er, Tm, Yb, Lu, and Y.

Figure 1:
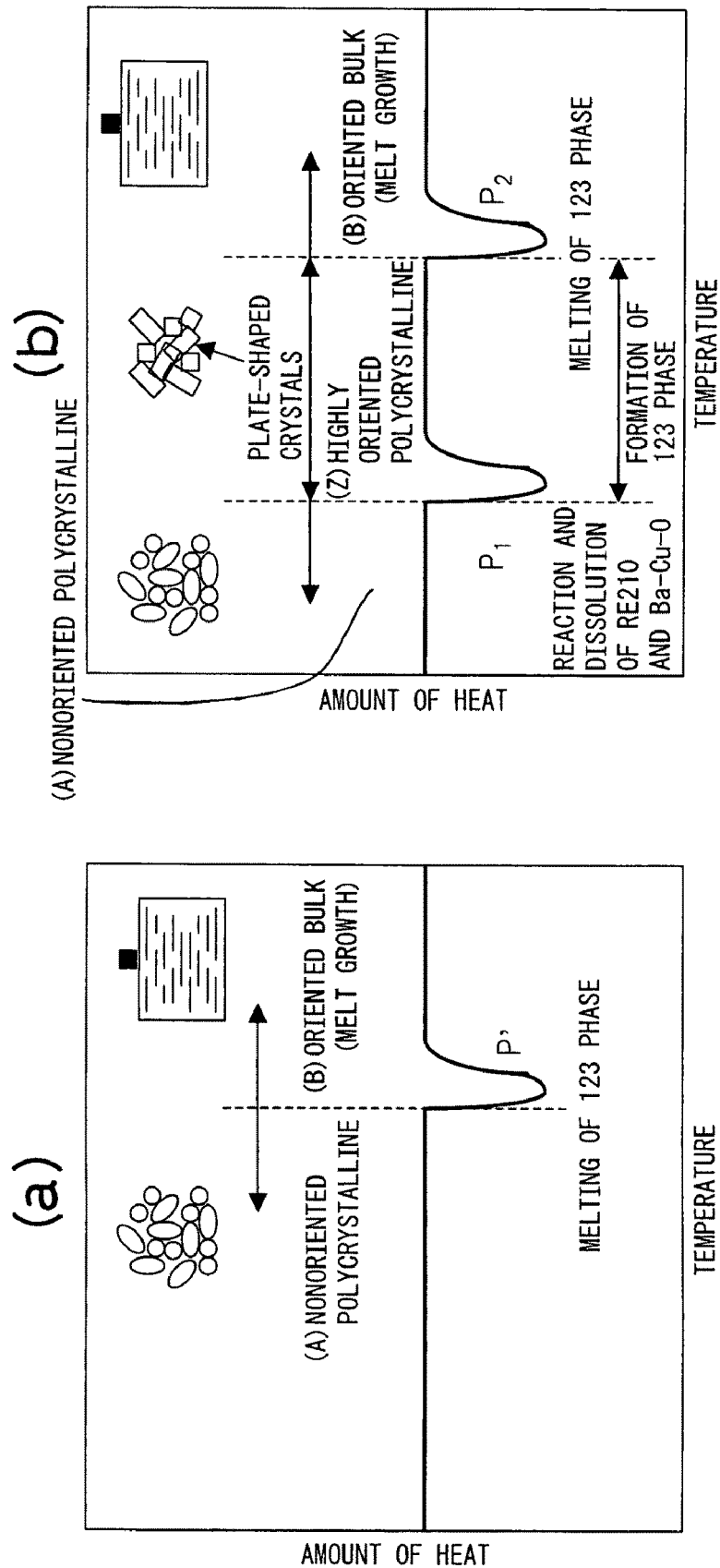
FIG. 1 is a view schematically showing differential thermal analysis curves according to a solid phase-liquid phase reaction of RE$_2$BaO$_4$ and a Ba—Cu—O-based material. (a) shows a thermal analysis curve when heating and raising the temperature of an REBa$_2$Cu$_3$O$_{7-\delta}$-based oxide powder in accordance with a conventional method and (b) shows a thermal analysis curve when mixing, heating, and raising the temperature of RE$_2$BaO$_4$ and Ba$_x$—Cu$_y$—O$_z$-based materials.

The inventors first investigated the factors affecting the $P_1$ temperature in FIG. 1(b).

As a result, it was learned that mainly (z1) the grain size of the powder material, (z2) the oxygen partial pressure of the reaction atmosphere, and (z3) the addition of Ag to the powder material influence the $P_1$ temperature.

Figure 2:
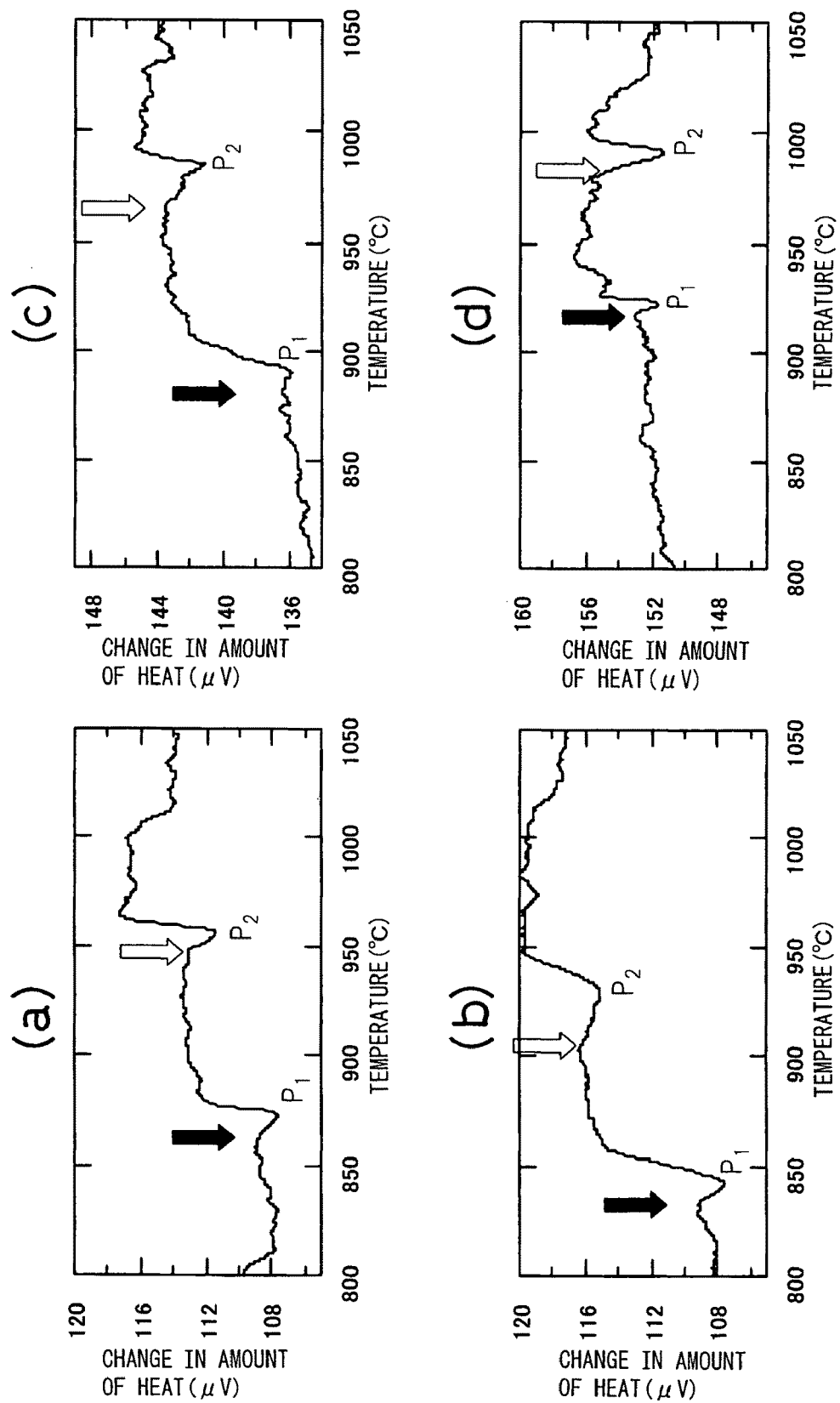
FIG. 2 is a view showing thermal analysis curves when heating and raising the temperature of various mixed materials. (a) shows a thermal analysis curve when heating and raising the temperature of a powder material, obtained by mixing powder materials of a grain size of 1 to 5 μm (Er$_2$BaO$_4$ powder and Ba$_x$—Cu$_y$—O$_z$-based powder) by a mixing ratio giving an Er123-based oxide and by further adding 3 mass % of Ag using Ag$_2$O (uncrushed powder material containing Ag), in an argon atmosphere containing 1% of oxygen (1% O$_2$—Ar). (b) shows a thermal analysis curve when heating and raising the temperature of a powder material of a grain size of approximately 0.1 μm, obtained by crushing the above uncrushed powder material containing Ag by a ball mill for approximately 4 hours (crushed powder material containing Ag), in 1% O$_2$—Ar. (c) shows a thermal analysis curve when heating and raising the temperature of the above uncrushed powder material containing Ag in the atmosphere. (d) shows a thermal analysis curve when heating and raising the temperature of a powder material, obtained by mixed powder materials of a grain size of 1 to 5 μm (Er$_2$BaO$_4$ powder and Ba$_x$—Cu$_y$—O$_z$-based powder) by a mixing ratio giving an Er123-based oxide (uncrushed powder material not containing Ag), in the atmosphere.

FIG. 2 shows thermal analysis curves when heating and raising the temperature of various mixed materials.

The thermal analysis curve shown in FIG. 2(a) is a thermal analysis curve when heating and raising the temperature of a powder material obtained by mixing powder materials of a grain size of 1 to 5 μm ($Er_2BaO_4$ powder and $Ba_x$—$Cu_y$—$O_z$-based powder) by a mixing ratio giving an Er123-based oxide and further adding 3 mass % of Ag using $Ag_2O$ (uncrushed powder material containing Ag), in an argon atmosphere containing 1% of oxygen (1% $O_2$—Ar).

Further, the thermal analysis curve shown in FIG. 2(b) is a thermal analysis curve when heating and raising the temperature of a powder material of a grain size of approximately 0.1 μm, obtained by crushing the above uncrushed powder material containing Ag by a ball mill for approximately 4 hours (crushed powder material containing Ag), in 1% $O_2$—Ar.

The two endothermic peaks $P_1$ and $P_2$ present at the two thermal analysis curves respectively correspond to the endothermic peaks $P_1$ and $P_2$ shown with FIG. 1(b). Further, the $P_1$ temperature in the thermal analysis curve of the uncrushed powder material containing Ag is approximately 860° C. (see FIG. 2(a)), while the $P_1$ temperature in the thermal analysis curve of the crushed powder material containing Ag is approximately 840° C. (see FIG. 2(b)). From this, it is understood that if the grain size of the mixed powder material is made smaller, the $P_1$ temperature decreases.

That is, by suitably selecting and setting the grain size of the powder material, it is possible to suitably adjust the temperature at which the $Ba_x$—$Cu_y$—$O_z$-based material (liquid phase) starts dissolving and the solid phase-liquid phase reaction producing the RE123-based oxide starts to occur, that is, the $P_1$ temperature.

Further, the thermal analysis curve shown in FIG. 2(c) is a thermal analysis curve when heating and raising the temperature of the above uncrushed powder material containing Ag in the atmosphere. The $P_1$ temperature in this thermal analysis curve is approximately 890° C.

Further, as clear from a comparison of the thermal analysis curve shown in FIG. 2(a) (heating uncrushed powder material containing Ag in 1% $O_2$—Ar) and the thermal analysis curve shown in FIG. 2(c) (similarly heating the uncrushed powder material containing Ag in the atmosphere), when the grain size of the powder material is the same, if making the oxygen partial pressure of the reaction atmosphere small (air→1% $O_2$), the $P_1$ temperature falls from 890° C. to 860° C.

Further, the thermal analysis curve shown in FIG. 2(d) is a thermal analysis curve when heating and raising the temperature of a powder material, obtained by mixing powder materials of a grain size of 1 to 5 μm ($Er_2BaO_4$ powder and $Ba_x$—$Cu_y$—$O_z$-based powder) by a mixing ratio giving an Er123-based oxide (not containing Ag, so hereinafter referred to as an "uncrushed powder material not containing Ag"), in the atmosphere. The $P_1$ temperature in this the thermal analysis curve is approximately 920° C.

As clear from a comparison of the thermal analysis curve shown in FIG. 2(c) (uncrushed powder material containing Ag heated in the atmosphere, $P_1$ temperature: approximately 890° C.) and the thermal analysis curve shown in FIG. 2(d) (uncrushed powder material not containing Ag heated in the atmosphere, $P_1$ temperature: approximately 920° C.), by the addition of Ag, the $P_1$ temperature falls from 920° C. to 890° C.

Figure 3:
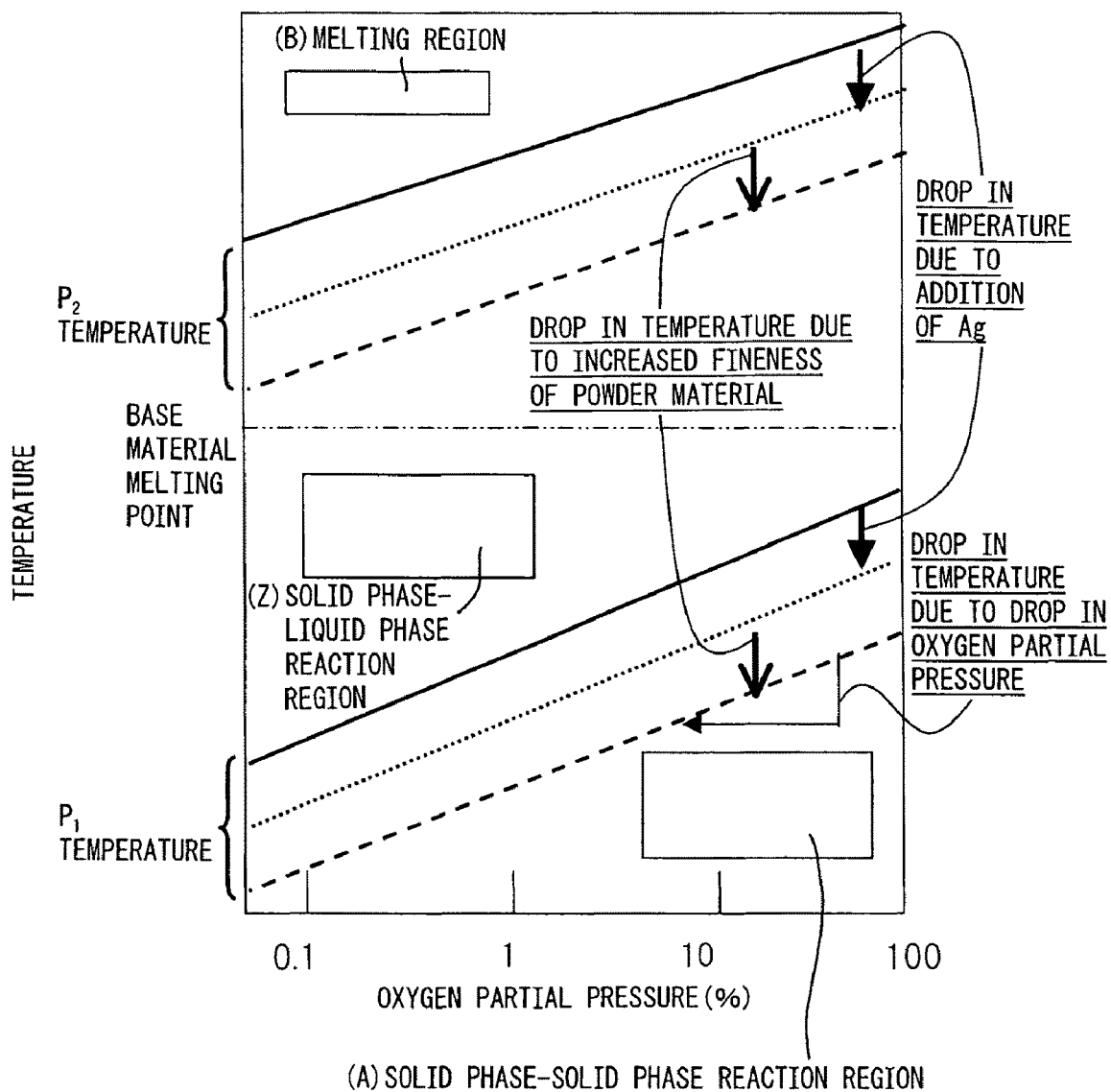
FIG. 3 is a view schematically showing the discoveries relating to lowering of the P$_1$ temperature all together.

FIG. 3 schematically shows the discoveries relating to the lowering of the above $P_1$ temperature all together. As clear from FIG. 3, by one or more of (z1) reducing the grain size of the powder material, (z2) lowering the oxygen partial pressure of the reaction atmosphere, and (z3) adding a required amount of Ag to the powder material, it is possible to lower the $P_1$ temperature. This discovery is the discovery forming the basis of the present invention.

As stated above, in lowering the $P_1$ temperature, it is possible to suitably select the above (z1), (z2), and/or (z3) to adjust and set the $P_1$ temperature to the required temperature, so the base material is not limited to one having a specific melting point.

In the production of the RE123-based oxide superconductor of the present invention, various base materials can be used, but among the base materials, a suitable base material is selected considering the level and suitability of the crystal orientation in the solid phase-liquid phase reaction region (see FIG. 3) defined by the $P_1$ temperature and base material melting point.

That is, in the present invention, it is possible to suitably select the above (z1), (z2), and/or (z3) in relation with the melting point of the selected base material so as to set the $P_1$ temperature to the required temperature or possible to suitably select the above (z1), (z2), and/or (z3) and select a base material having the required melting point in relation to the set $P_1$ temperature.

Therefore, the inventors used an MgO substrate as the base material, formed an RE123-based oxide superconductor layer on this, and investigated the crystal orientation and the superconducting characteristics. Below, the results of the investigation will be explained.

2) Formation of Superconductor on MgO Substrate

The melting point of MgO is 1600° C. or more and is positioned at the far higher temperature side than the $P_1$ temperature and the $P_2$ temperature, so a MgO substrate is suitable as a substrate for evaluating the orientation of the polycrystalline structure formed by the "(Z) high orientation polycrystalline structure" in FIG. 1(b).

A mixed powder material of a grain size of approximately 0.1 μm (obtained by mixing 1 to 5 μm $Er_2BaO_4$ powder and same $Ba_x$—$Cu_y$—$O_z$-based powder by a mixing ratio giving $ErBa_2Cu_3O_{7-\delta}$, further adding 3 mass % of Ag using $Ag_2O$, then crushing for approximately 4 hours) was deposited on the MgO substrate and heated in 1% $O_2$—Ar at 940° C. for 3 hours.

Figure 4:
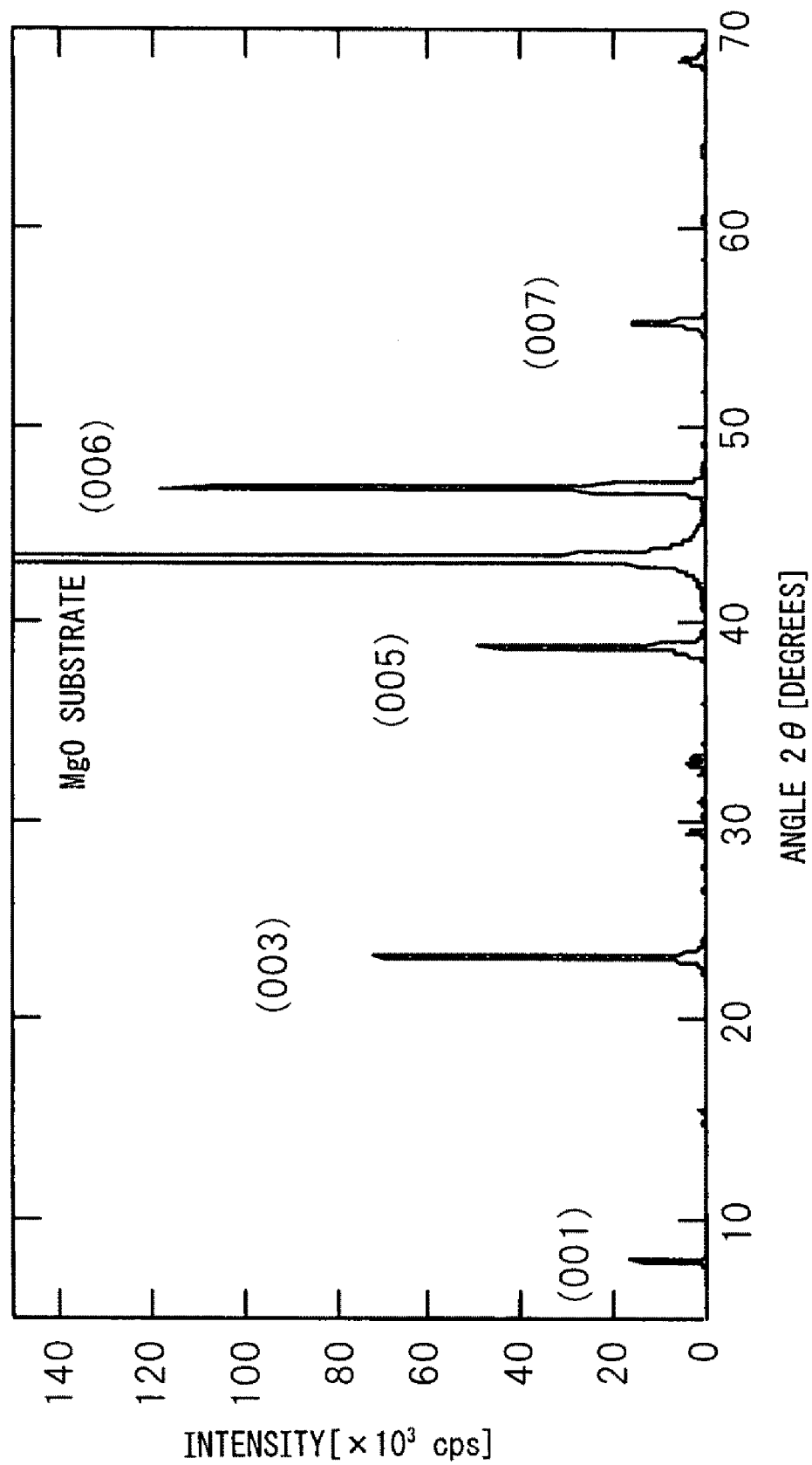
FIG. 4 is a view showing an X-ray diffraction intensity of a product obtained by depositing a mixed powder material of a grain size of approximately 0.1 μm (obtained by mixing a 1 to 5 μm Er$_2$BaO$_4$ powder and the same Ba$_x$—Cu$_y$—O$_z$-based powder by a mixing ratio giving ErBa$_2$Cu$_3$O$_{7-\delta}$ and further adding 3 mass % of Ag using Ag$_2$O, then crushing for approximately 4 hours) on an MgO base material, then heating in 1% O$_2$—Ar at 940° C. for 3 hours.

FIG. 4 shows the X-ray diffraction intensity of the product obtained by the above heating. In FIG. 4, the intensity of Miller indices (00n) strongly appear, so the MgO substrate is formed with $ErBa_2Cu_3O_{7-\delta}$ having a crystal structure with the c-axis oriented vertical to the substrate surface.

Figure 5:
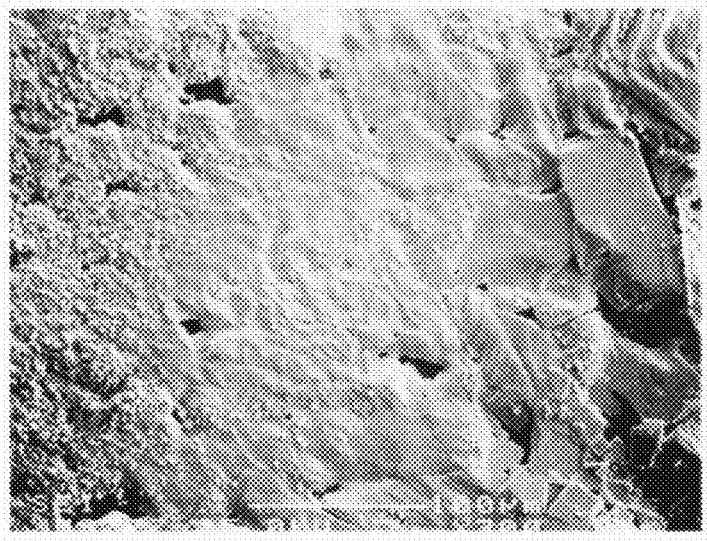
FIG. 5 is a view showing the results of observation of the above product (ErBa$_2$Cu$_3$O$_{7-\delta}$) by a scanning electron microscope (SEM) (X300 micrograph).

FIG. 5 shows the result of observation of the above $ErBa_2Cu_3O_{7-\delta}$ by a scanning electron microscope (SEM) (X300 micrograph). From this figure, it is understood that the MgO substrate is formed with $ErBa_2Cu_3O_{7-\delta}$ having a crystal structure of plate-shaped crystals of 10 to 100 μm size connected without gaps.

In this way, as shown in FIG. 4 and FIG. 5, by the solid phase-liquid phase reaction of the present invention, the MgO substrate is formed with plate-shaped $ErBa_2Cu_3O_{7-\delta}$ having a crystal structure where the c-axis is oriented vertical to the substrate surface and the a-b plane is parallel to the substrate surface.

Further, to make the above $ErBa_2Cu_3O_{7-\delta}$ superconductive, this is treated to add oxygen at 300 to 700° C. It was confirmed that the $ErBa_2Cu_3O_{7-\delta}$ is a superconductor of an onset critical temperature ($T_c$) of approximately 90K.

Figure 6:
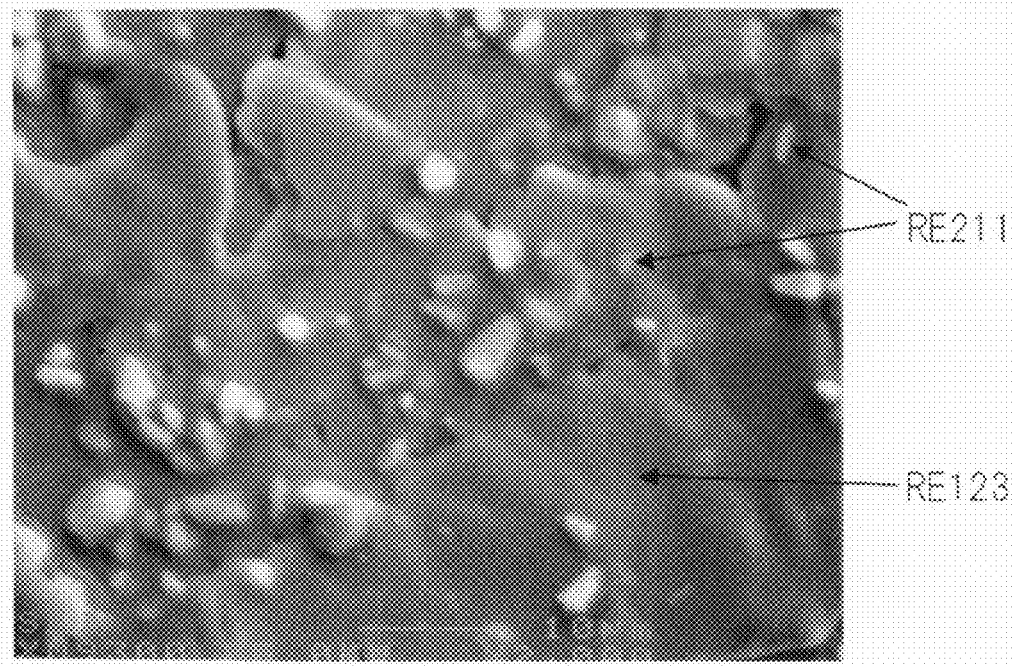
FIG. 6 is a view showing results of observation of a product, obtained by depositing a mixed powder material of a grain size of approximately 0.1 μm (obtained by mixing a 1 to 5 μm Er$_2$BaO$_4$ powder and the same Ba$_x$—Cu$_y$—O$_z$-based powder by a mixing ratio giving a ErBa$_2$Cu$_3$O$_{7-\delta}$ and Er211 phase and further adding 3 mass % of Ag using Ag$_2$O, then crushing for approximately 4 hours) on an MgO base material, then heating in 1% O$_2$—Ar at 940° C. for 3 hours, by a scanning electron microscope (SEM) (X2000 micrograph).

Further, FIG. 6 shows the results of observation of a product obtained by depositing a mixed powder material having a grain size of approximately 0.1 μm and containing Ag in 3 mass % (obtained by mixing 1 to 5 μm $Er_2BaO_4$ powder and the same $Ba_x$—$Cu_y$—$O_z$-based powder by an Er excess mixing ratio by which $ErBa_2Cu_3O_{7-\delta}$ and non-superconducting phase $Er_2BaCuO_5$ (hereinafter referred to as the "Er211 phase") are produced, further adding 3 mass % of Ag was added using $Ag_2O$, then crushing for approximately 4 hours) on the MgO substrate and heating in 1% $O_2$—Ar at 940° C. for 3 hours (X2000 micrograph) by a scanning electron microscope (SEM).

From this figure, it is understood that the MgO substrate is formed with $ErBa_2Cu_3O_{7-\delta}$ having a crystal structure where the above plate-like crystals of $ErBa_2Cu_3O_{7-\delta}$-based oxide are connected without gap and, in addition to these crystals, there are needle-shaped Er211 phase fine grains of a size of several μm (confirmed by electron microanalyzer).

The non-superconducting phase $RE_2BaCuO_5$ present in the superconductor (bulk) (hereinafter referred to as the "RE211 phase") acts to pin the magnetic flux penetrating the superconductor and remarkably raise the current characteristics. It is known that rather than granular shaped crystals, needle-shaped ones are more superior in terms of the pinning effect. This action is naturally also expected from the RE211 phase (non-superconducting phase) present dispersed in the plate-shaped RE123-based oxide crystals formed on the MgO substrate.

Consequently, according to the solid phase-liquid phase reaction of the present invention, the MgO substrate can be stably formed with a plate-shaped RE123-based oxide superconductor having a crystal structure where the c-axis is oriented vertical to the substrate surface, the a-b plane is parallel to the substrate surface, and RE211 phase (non-superconducting phase) fine grains are dispersed and with superior crystal orientation and current characteristics.

Furthermore, the inventors confirmed even when using a powder material comprised of $Gd_2BaO_4$ powder and $Ba_x$—$Cu_y$—$O_z$-based powder mixed together and not adding Ag, the MgO substrate can be stably formed with plate-shaped $GdBa_2Cu_3O_{7-\delta}$ superior in crystal orientation in the same way as the case of the above $ErBa_2Cu_3O_{7-\delta}$.

In this way, the inventors confirmed that according to the solid phase-liquid phase reaction of the present invention, an MgO substrate can be stably formed with a plate-shaped RE123-based oxide superconductor having superior "crystal orientation and current characteristics" comprised of a crystal structure where the c-axis is oriented vertical to the substrate surface and the a-b plane is parallel to the substrate surface or a plate-like RE123-based oxide superconductor having a superior crystal orientation comprised of a crystal structure comprised of the above crystal structure in which the RE211 phase (non-superconducting phase) fine grains are dispersed.

3) Formation of Superconductor on Ag Substrate

When forming an RE123-based oxide superconductor into wire, a metal base material must be formed with a conductive layer which includes the RE123-based oxide superconductor.

Consequently, the inventors, in order to confirm that even an Ag base material generally used with the PIT method and the like can be formed with an RE123-based oxide superconductor superior in crystal orientation using the solid phase-liquid phase reaction of the present invention, changed the MgO substrate to an Ag substrate, formed an RE123-based oxide on the Ag substrate, and investigated the crystal orientation and the superconducting characteristics of the oxide. Below, the results of the investigation are explained.

(1) A mixed powder material of a grain size of approximately 0.1 μm (obtained by mixing 1 to 5 μm $Er_2BaO_4$ powder and the same $Ba_x$—$Cu_y$—$O_z$-based powder by a mixing ratio giving $ErBa_2Cu_3O_{7-\delta}$, further adding 3 mass % of Ag using $Ag_2O$, and crushing it for approximately 4 hours) was deposited on an Ag substrate and heated in 1% $O_2$—Ar at 940° C. for 3 hours.

Further, after the above heating, the product obtained by the heating was treated to add oxygen at 300 to 700° C.

Figure 7:
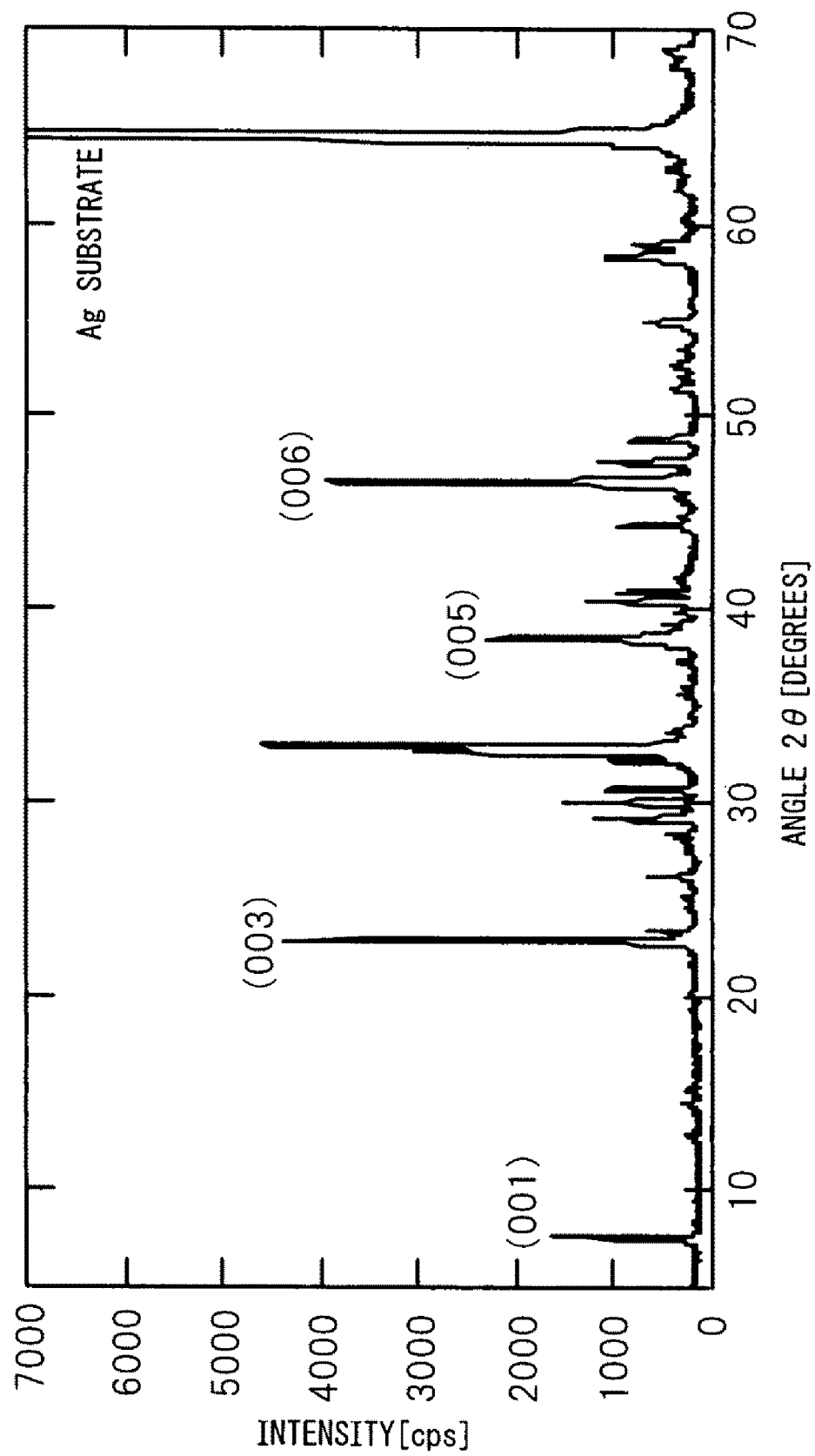
FIG. 7 is a view showing an X-ray diffraction intensity of a product obtained by depositing a mixed powder material of a grain size of approximately 0.1 μm (obtained by mixing a 1 to 5 μm Er$_2$BaO$_4$ powder and the same Ba$_x$—Cu$_y$—O$_z$-based powder by a mixing ratio giving ErBa$_2$Cu$_3$O$_{7-\delta}$ and further adding 3 mass % of Ag using Ag$_2$O, then crushing for approximately 4 hours) on an Ag base material, then heating in 1% O$_2$—Ar at 940° C. for 3 hours (ErBa$_2$Cu$_3$O$_{7-\delta}$).

FIG. 7 shows the X-ray diffraction intensity of the product obtained by the above heating. As shown in FIG. 7, the intensity of the Miller indices (00n) strongly appears, so the Ag substrate is formed with $ErBa_2Cu_3O_{7-\delta}$ in which the c-axis is oriented vertical to the substrate surface.

Figure 8:
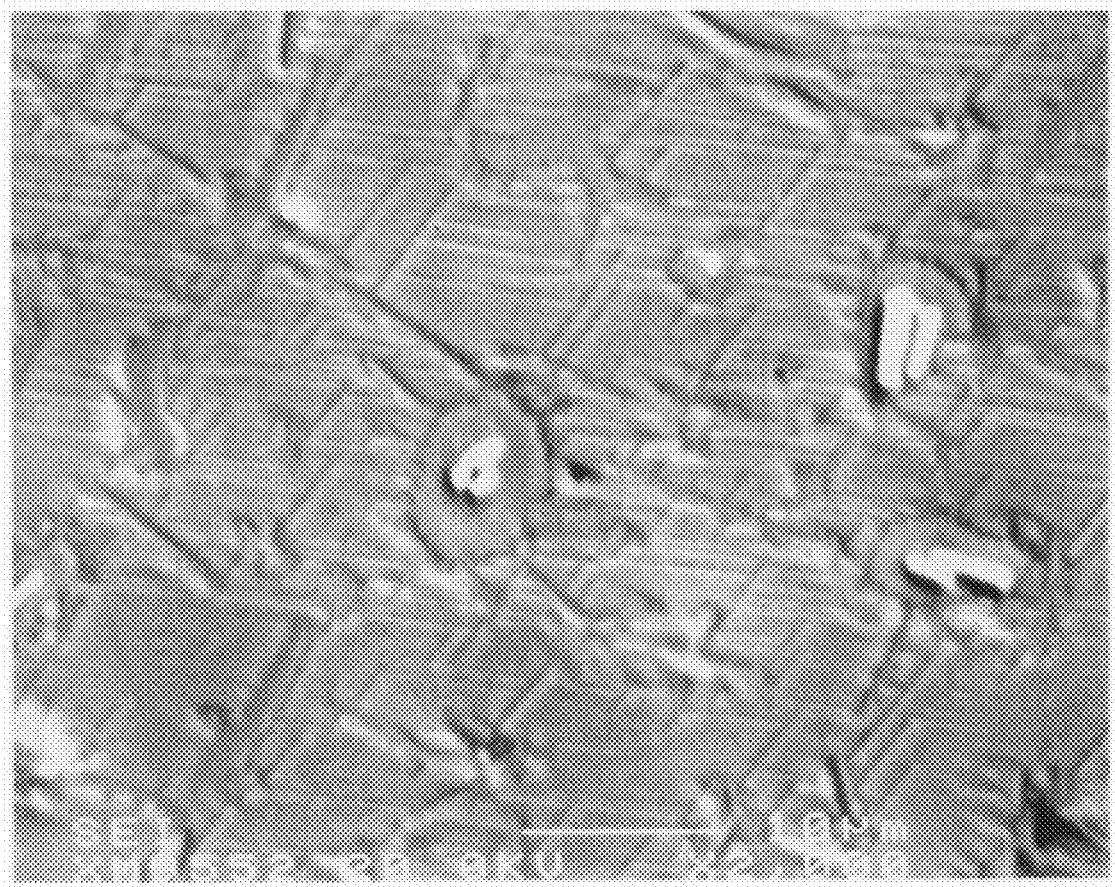
FIG. 8 shows the results of observation of the above product (ErBa$_2$Cu$_3$O$_{7-\delta}$) by a scanning electron microscope (SEM) (X2000 micrograph).

Further, FIG. 8 shows the results of observation of the above product ($ErBa_2Cu_3O_{7-\delta}$) by a scanning electron microscope (SEM) (X2000 micrograph). From FIG. 8, it is learned that the Ag substrate is formed with $ErBa_2Cu_3O_{7-\delta}$ having a crystal structure in which plate-shaped crystals of 10 μm or so are connected without gaps.

In this way, from FIG. 7 and FIG. 8, it can be confirmed that the Ag substrate is formed with plate-shaped $ErBa_2Cu_3O_{7-\delta}$ having a crystal structure in which the c-axis is oriented vertical to the substrate surface and the a-b plane is parallel to the substrate surface.

Figure 9:
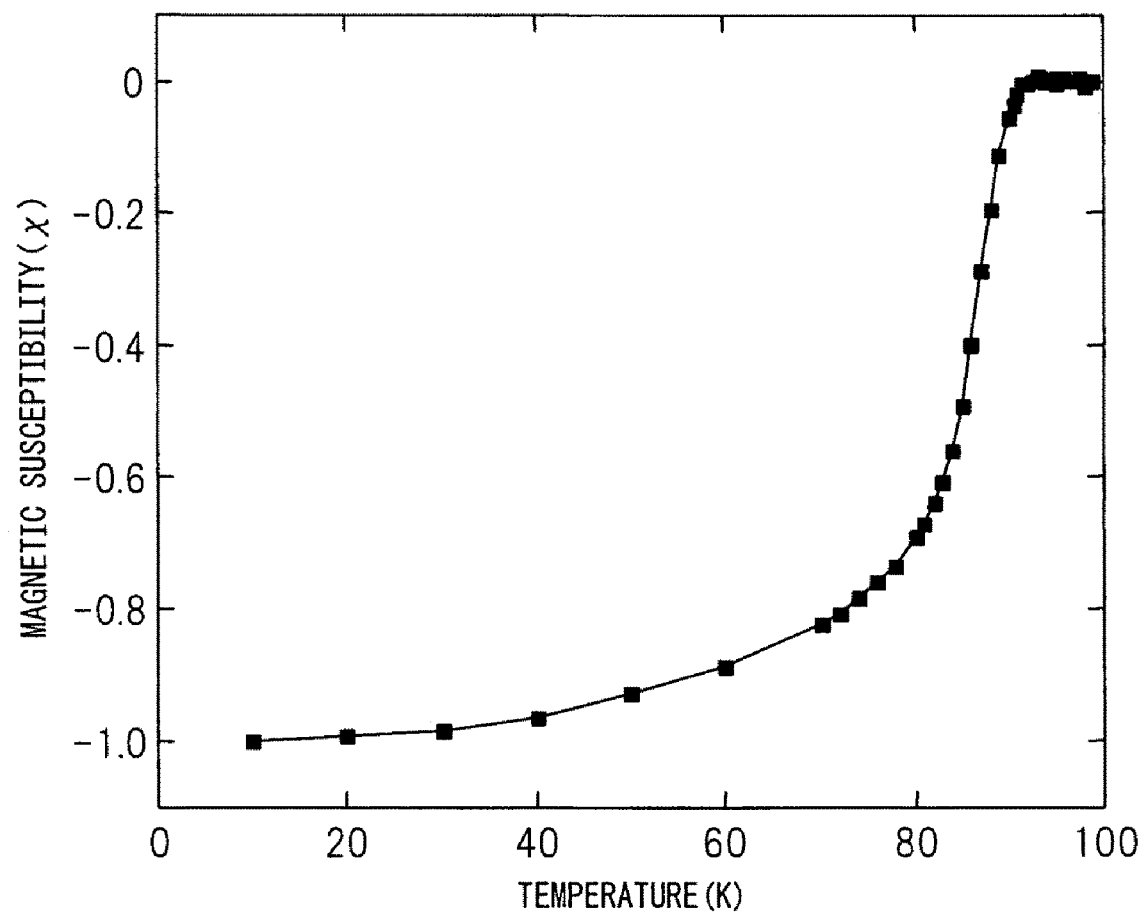
FIG. 9 is a view showing a temperature dependency of a magnetic susceptibility of the above product (ErBa$_2$Cu$_3$O$_{7-\delta}$) treated by adding oxygen.
Figure 10:
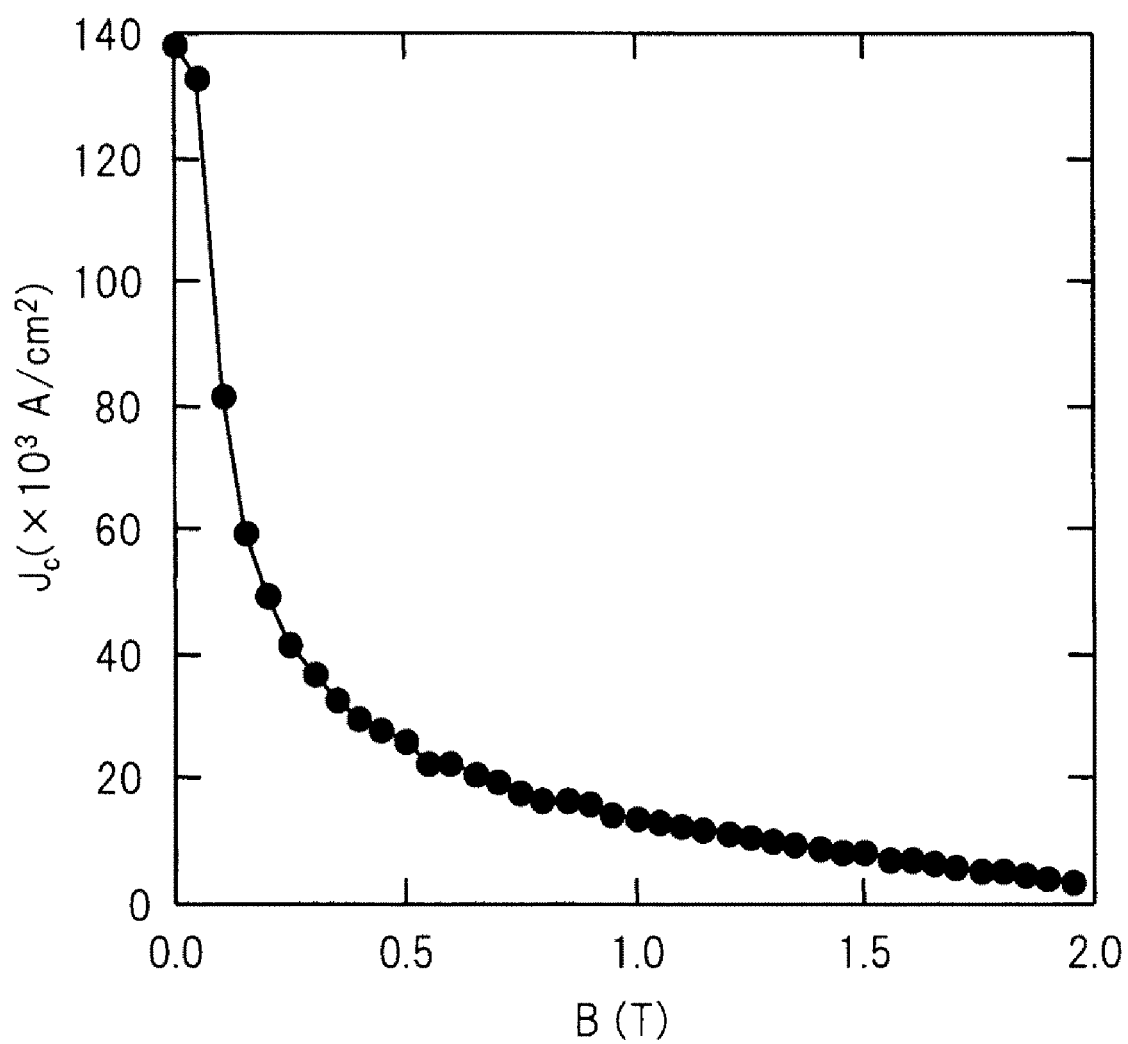
FIG. 10 is a view showing a magnetic field (B) dependency of a critical current density ($J_c$) of the above product ($ErBa_2Cu_3O_{7-\delta}$) treated by adding oxygen.

Here, the "temperature dependency of the magnetic susceptibility" and "magnetic field dependency of the critical current density" after treating the above product ($ErBa_2Cu_3O_{7-\delta}$) for addition of oxygen at 300 to 700° C. are shown, respectively, in FIG. 9 and FIG. 10.

According to FIG. 9, the above product ($ErBa_2Cu_3O_{7-\delta}$) is a superconductor with an onset critical temperature ($T_c$) of approximately 90K. That is, the Ag substrate is formed with a plate-shaped $ErBa_2Cu_3O_{7-\delta}$ superconductor with a c-axis oriented vertical to the substrate surface and with an a-b plane parallel to the substrate surface even if not using seed crystals forming the nuclei for oriented crystals.

Further, according to FIG. 10, the above product ($ErBa_2Cu_3O_{7-\delta}$) carries a current of $0.5 \times 10^4$ $A/cm^2$ or so even in a magnetic field of 2 T and has a high irreversible magnetic field ($B_{irr}$) (note that the irreversible magnetic field ($B_{irr}$) of a Bi-based superconducting material is 0.5 T or less).

In this way, the inventors obtained the discovery that, in the solid phase-liquid phase reaction of the present invention, in accordance with the findings discovered by the inventors, it is possible to lower the $P_1$ temperature at which an endothermic reaction starts to a temperature of the melting point of the Ag base material (approximately 960° C.) or less and, as a result, stably form a plate-shaped RE123-based oxide superconductor having superior crystal orientation and current characteristics on an Ag substrate.

Further, the above discovery predicts the possibility that an RE123-based oxide superconductor, which conventionally has been considered unsuitable for making wire, can be made into wire by the PIT method. It is an important discovery in realizing a wire of an RE123-based oxide superconductor.

(2) A mixed powder material of a grain size of approximately 0.1 μm (obtained by mixing 1 to 5 μm $Er_2BaO_4$ powder and the same $Ba_x$—$Cu_y$—$O_z$-based powder by an Er excess mixing ratio whereby $ErBa_2Cu_3O_{7-\delta}$ and the Er211 phase are produced, further adding 3 mass % of Ag using $Ag_2O$, and crushing for approximately 4 hours) was deposited on the Ag substrate and heated in 1% $O_2$—Ar at 940° C. for 3 hours.

From the X-ray diffraction strength and SEM photograph of the product obtained by the above heating, it was confirmed that the product is $ErBa_2Cu_3O_{7-\delta}$ having a crystal structure in which Er211 phase (non-superconducting phase) fine grains are dispersed.

The above Er211 phase (non-superconducting phase) fine grains, as previously stated, have the action of pinning the magnetic flux penetrating the superconductor, so the current characteristics of the above product having the above Er211 phase (non-superconducting phase) fine grains are guessed to be more superior.

(3) Above, the formation of an RE123-based oxide superconductor having a superior crystal orientation on an Ag substrate was explained. The unique point in the formation of the superconductor not present in the past is that despite external pressure, which governs the orientation direction of crystals, not being applied to the crystals, as shown in FIG. 7 and FIG. 8, the c-axis of the crystals of the RE123-based oxide is oriented vertical to the substrate surface on the Ag substrate.

If it were just that a solid phase-liquid phase reaction of the $RE_2BaO_4$ powder (solid phase component) and $Ba_x$—$Cu_y$—$O_z$-based powder (liquid phase component) caused the formation of crystals of the RE123-based oxide on the non-crystal oriented Ag substrate, it would be difficult to consider that any specific crystallization axis was oriented with regards to the Ag substrate surface, but when the above solid phase-liquid phase reaction occurs on an Ag substrate, in addition to the solid phase-liquid phase reaction, a reaction of Ag (solid phase) and the Ba—Cu—O-based liquid phase occurs. As a result, the Ag interface is formed with a liquid phase film in which Ag is dissolved. It is thought that this liquid phase film greatly contributes to the orientation of the crystals of the RE123-based oxide produced by the above solid phase-liquid phase reaction.

That is, as shown in FIG. 11, due to the synergistic action of the production of crystals of RE123-based oxide by the above solid phase-liquid phase reaction and the liquid phase present at the Ag substrate interface, at a temperature of the melting point of Ag or less, the crystals of the RE123-based oxide are produced on the Ag substrate in a plate shape and oriented.

The details concerning the above synergistic action are still not clear, but due to the synergistic action, for example, it is thought that the crystal growth of any one of the following (A1) to (A3) proceeds.

(A1) The geometrically stable a-b plane of the crystals grown in a plate shape is oriented parallel to the substrate surface on the liquid phase formed at the Ag interface.

(A2) The liquid phase formed at Ag interface acts as a flux for the growth, and crystals are formed at the surface of the liquid phase and grow two-dimensionally on the liquid phase surface.

(A3) The production of the liquid phase at the Ag interface is limited to the Ag surface, so the directions which the crystals can grow end up being limited to the two-dimensional directions. The growth of the a-b plane is limited to the substrate surface (two-dimensional) direction resulting in orientation.

However, in any case, the discovery that at the time of crystal growth, even without applying external pressure for orienting the crystals, the solid phase-liquid phase reaction of the present invention enables the formation of an RE123-based oxide superconductor comprised of crystals with a c-axis oriented vertical to the Ag substrate surface is a discovery newly made by the inventors.

Further, the RE123-based oxide superconductor on the Ag substrate is produced by the solid phase-liquid phase reaction which essentially occurs on the Ag, so if using the solid phase-liquid phase reaction of the present invention, even a long Ag base material can be similarly formed with an RE123-based oxide superconductor superior in crystal orientation and current characteristics.

In this case, if using an Ag base material giving a two-axis orientation for the rolling or other processing instead of an Ag base material with no crystal orientation, production of oriented RE123-based oxide crystals becomes easier.

Furthermore, a long Ag base material is a base material widely used for forming a Bi-based superconducting oxide into wire and for forming a multi-core wire, so the RE123-based oxide superconductor of the present invention is suitable for fabrication of a single core or multi-core wire by the PIT method using a long Ag base material.

4) Characteristic Requirements of Present Invention

Here, the characteristic requirements forming the present invention will be explained.

(1) First, the characteristic requirements forming the RE123-based oxide superconductor of the present invention (the present invention superconductor) will be explained.

In the present invention superconductor, the holding member is formed with a conductive layer containing an $REBa_2Cu_3O_{7-\delta}$-based oxide superconductor produced using at least $RE_2BaO_4$ and a $Ba_x$—$Cu_y$—$O_z$-based materials.

Here, RE is one or more elements selected from La, Nd, Sm, Eu, Gd, Dy, Ho, Er, Tm, Yb, Lu, and Y and is selected considering the desired crystal orientation and superconducting characteristics.

The $Ba_x$—$Cu_y$—$O_z$-based material is a mixture of a metal oxide and/or its compounds (for example, $BaCuO_2$, $CuO$) by the required mixing ratio. This mixed material may have 15 mass % of Ag or an Ag oxide added to it. The addition of Ag or an Ag oxide is desirable from the viewpoint of lowering the $P_1$ temperature more.

The mixing ratio of Ba, Cu, and O (x, y, and z) may be selected considering the composition, characteristics, structure, and the like of the RE123-based oxide, but if considering the fact that CuO is in a solid solution in the Ag base material, though slight, and that when necessary a suitable quantity of the RE211 phase (non-superconducting phase) is produced dispersed in the RE123-based oxide crystals, the ratio is preferably selected in a range satisfying:

$$2x \leq y \leq 2.2x \text{ and } z=x+y$$

That is, by suitably selecting the mixing ratio of $RE_2BaO_4$ and the $Ba_x$—$Cu_y$—$O_z$-based material and/or the mixing ratio (x, y, and z) of Ba, Cu, and O, it is possible to produce an RE123-based oxide superconductor in which the non-superconducting phase (RE211 phase) is dispersed.

The non-superconducting phase has the function of trapping and immobilizing (pinning) the magnetic flux penetrating the superconductor, so is an important presence in improving the magnetic field dependency of the superconducting current.

In order for the conductive layer containing the $REBa_2Cu_3O_{7-\delta}$-based oxide superconductor to maintain the characteristics of the conductive layer, it may be coated with a protective layer or stabilizing layer.

The holding member holding the conductive layer may be covered by a crystal orientation promotion layer, strain buffer layer, diffusion prevention layer, current leakage prevention layer, or other intermediate layer having functions contributing to an increase in the superconducting characteristics.

In order for the intermediate layer to exhibit the above functions, it is desirable to form it by a metal oxide (for example, MgO), a composite oxide, or a metal oxide or compound oxide having a high electrical resistance.

Because the illustrated MgO substrate, explained above, is formed with an RE123-based oxide superconductor having a superior crystal orientation, MgO is suitable as the material forming the intermediate layer increasing the crystal orientation.

The holding member is not limited to any specific shape. Further, the manner by which the holding member holds the conductive layer is not limited to any specific manner. For example, when the holding member is long, it is possible to use part of it to contact the conductive layer to hold the conductive layer at the cross-section vertical to the longitudinal direction. Further, it is possible to make the entire circumference contact the conductive layer to hold the conductive layer.

As the long holding member, a tube-shaped or strip-shaped member can be used. As a tube-shaped member, a tube-shaped member having a circular ring closed cross-section or a flat rectangular closed configuration cross-section is preferable.

Further, if considering drawing the superconductor to make it into a wire, the holding member is preferably formed by a metal material. As the metal material, one satisfying the following two conditions is preferable:

(i) Not reacting with the chemically active liquid phase formed in the solid phase-liquid phase reaction and (ii) Allowing permeation of oxygen in treatment to add oxygen to raise the superconducting characteristics.

Further, Ag or an Ag base material is most preferable as a metal material satisfying the above two conditions.

Further, the holding member may be formed by a composite metal material using Ag or an Ag base material to cover the surface of the member directly contacting the mixed materials comprised of at least $RE_2BaO_4$ and the $Ba_x$—$Cu_y$—$O_z$-based material. Further, the holding member may be a member which is worked as required in advance, then given orientation of the surface structure in the longitudinal direction of the member.

(2) Next, the characterizing requirements of the method of production of the present invention superconductor will be explained.

In the method of production of the present invention superconductor, (a) part of the mixed materials obtained by mixing at least $RE_2BaO_4$ and a $Ba_x$—$Cu_y$—$O_z$-based material is brought into contact with the holding member, then (b) this is heated in an atmosphere containing oxygen together with the holding member to a temperature of the dissolution temperature of the $Ba_x$—$Cu_y$—$O_z$-based material or more to form a conductive layer containing an $REBa_2Cu_3O_{7-\delta}$-based oxide superconductor.

Note that RE, as previously stated, is one or more elements selected from La, Nd, Sm, Eu, Gd, Dy, Ho, Er, Tm, Yb, Lu, and Y.

In order to produce the $REBa_2Cu_3O_{7-\delta}$ oxide by the solid phase-liquid phase reaction of the present invention, the mixed materials deposited on the holding member are heated in an atmosphere containing oxygen together with the holding member to a temperature of the dissolution temperature of the $Ba_x$—$Cu_y$—$O_z$-based material or more.

As shown in FIG. 1(b), at the same time as the dissolution of the $Ba_x$—$Cu_y$—$O_z$-based material, the reaction with $RE_2BaO_4$ starts, so the lower limit of the heating temperature producing the $REBa_2Cu_3O_{7-\delta}$ oxide is defined as the dissolution temperature of the $Ba_x$—$Cu_y$—$O_z$-based material, that is, the $P_1$ temperature of the endothermic peak $P_1$.

The dissolution temperature ($P_1$ temperature) of the $Ba_x$—$Cu_y$—$O_z$-based material can be lowered by suitably employing the above (z1), (z2), and/or (z3). For example, it is preferable to use one or a suitable combination of (z1') reducing the grain size of the mixed materials to less than 1 µm, (z2') reducing the oxygen partial pressure of the atmosphere containing oxygen to 0.02 MPa or less, (z3') adding 15 mass % or less of Ag or an Ag oxide to the mixed material, or other means so as to lower the dissolution temperature of the $Ba_x$—$Cu_y$—$O_z$-based material more.

The above dissolution temperature is also dependent on the composition of the $Ba_x$—$Cu_y$—$O_z$-based material. It cannot be specified as any particular temperature. Further, there is no need to specify it. However, a dissolution temperature determined when selecting x, y, and z in a range satisfying $2x \leq y \leq 2.2x$ and $z=x+y$ is preferable in promoting the solid phase-liquid phase reaction of the present invention at the surface of the holding member formed by a metal material.

Note that as clear from FIG. 1(b), if the heating temperature is less than the dissolution temperature of the $Ba_x$—$Cu_y$—$O_z$-based material, the reaction becomes a solid phase-solid phase reaction, and oriented $REBa_2Cu_3O_{7-\delta}$ oxide cannot be obtained.

The upper limit of the heating temperature should be the melting point of the holding member or less. When the heating temperature exceeds the melting point of the $REBa_2Cu_3O_{7-\delta}$ oxide, heating, then slow cooling or the less may be used for crystallization at the melting point of the $REBa_2Cu_3O_{7-\delta}$ oxide or less.

In the present invention, as previously stated, the P1 temperature is lowered by suitably employing the above (z1), (z2), and/or (z3), so the melting point of the holding member also does not have to be limited to a specific temperature range. However, the melting point of the holding member must be the $P_1$ temperature or ore.

Further, in the method of production of the present invention superconductor, (a) part of the mixed materials obtained by mixing at least $RE_2BaO_4$ and a $Ba_x$—$Cu_y$—$O_z$-based material is brought into contact with the holding member, then (b) this is drawn one time or more, then (c) this is heated in an atmosphere containing oxygen together with the holding member to a temperature of the dissolution temperature of the $Ba_x$—$Cu_y$—$O_z$-based material or more to form a conductive layer containing an $REBa_2Cu_3O_{7-\delta}$ based oxide superconductor.

In this method of production, before forming the oriented crystal of the $REBa_2Cu_3O_{7-\delta}$ oxide by the solid phase-liquid phase reaction of the present invention, this is drawn one time or more to increase the contact area of part of the mixed materials and the holding member. This point is a characterizing feature.

Further, by repeating the treatments of the above (b) and (c), a long RE123-based oxide conductor more improved in crystal orientation and current characteristics can be produced.

Further, in the method of production of the present invention superconductor, (a) part of the mixed materials obtained by mixing at least $RE_2BaO_4$ and a $Ba_x$—$Cu_y$—$O_z$-based material is brought into contact with the holding member, then (b) this is heated in an atmosphere containing oxygen together with the holding member to a temperature of the dissolution temperature of the $Ba_x$—$Cu_y$—$O_z$-based material while drawing it one time or more so as to form a conductive layer containing an $REBa_2Cu_3O_{7-\delta}$-based oxide superconductor.

In this way, in the method of production of the present invention superconductor, the heating and drawing may be performed simultaneously. By this simultaneous heating and drawing, it is possible to produce a long RE123-based superconductor superior in crystal orientation and current characteristics.

Further, by repeating the treatment of the above (b), a long RE123-based oxide conductor more improved in crystal orientation and current characteristics can be produced.

Furthermore, when forming the conductive layer containing the $REBa_2Cu_3O_{7-\delta}$-based oxide superconductor, after heating to a temperature of the dissolution temperature of the $Ba_x$—$Cu_y$—$O_z$-based material or more, the heat treatment for heating to a temperature lower than that temperature may be performed one time or more.

In the present invention, a solid phase ($RE_2BaO_4$)-liquid phase ($Ba_x$—$Cu_y$—$O_z$-based material) reaction is used to form a conductive layer containing an $REBa_2Cu_3O_{7-\delta}$-based oxide superconductor. At this time, the liquid phase is produced by heating to a temperature (P temperature) of the dissolution temperature ($P_1$ temperature) of the $Ba_x$—$Cu_y$—$O_z$-based material or more, then holding the material at a temperature (P' temperature) lower than the temperature (P temperature) of the dissolution temperature or more for heat treatment.

The above heat treatment may be used to suppress the reaction producing the non-superconducting phase and form a conductive layer superior in crystal orientation on the surface of the holding member. Further, by suitably selecting the heat treatment temperature (P' temperature), it is possible to control the crystal growth of the $REBa_2Cu_3O_{7-\delta}$-based oxide formed, so the size of the crystals can be suitably controlled and a conductive layer comprised of $REBa_2Cu_3O_{7-\delta}$ based oxide more superior in crystal orientation can be formed on the surface of the holding member.

The above heat treatment is not limited to a single instance and may be performed a plurality of times so as to stabilize and improve the characteristics of the conductive layer. The temperature (P' temperature) when performing the above heat treatment is not limited to any specific temperature so long as it is a temperature lower than the temperature of heating the starting mixed materials, that is, the temperature (P temperature) of the dissolution temperature ($P_1$ temperature) of the $Ba_x$—$Cu_y$—$O_z$-based material or more. Note that if the temperature is the $P_1$ temperature or less, this is preferable in the point of the suppression of formation of a non-superconducting phase and control of the formation of plate-like crystals of the 123 phase.

The reason why the above heat treatment causes the crystal orientation to be improved is believed to be as follows:

It is known that when using a liquid phase containing a large amount of CuO to fabricate RE123 crystals, the crystals grow into plate-shaped crystals thin in the c-axis direction (see "J. Wojcik, M. Rosochowska, H. Niculescu, A. Pajaczkowska, *J. Cryst. Growth* 91[3] (1988) 255-260". This research paper reports that "plate-shaped Y123 crystals thin in the c-axis direction can be obtained".)

In the case of the present invention, it was confirmed that if performing heat treatment heating the $Ba_x$—$Cu_y$—$O_z$-based material to a temperature (P temperature) of the dissolution temperature ($P_1$ temperature) of the materials or more, the ratio of the $RE_2BaCuO_5$ solid phase (211 phase) increases.

From this, if performing the first stage heat treatment over a long time, part of the solid phase ($RE_2BaO_4$) probably changes to a $RE_2BaCuO_5$ solid phase and the liquid phase composition changes from (3BaO+6CuO) to (3BaO+5CuO) whose CuO is low, but if the liquid phase composition changes, probably the crystals produced easily become block-shaped, the crystal orientation falls, and the amount of the $RE_2BaCuO_5$ solid phase (211 phase) or other non-superconducting phase remaining in the superconducting phase increases.

On the other hand, when ending the first stage heat treatment in a short time where the ratio of the $RE_2BaCuO_5$ solid phase (211 phase) does not increase, that is, where the composition of the liquid phase produced does not change, then suitably performing the next heat treatment (second stage heat treatment) at a temperature lower than the first heat treatment temperature (P temperature) to grow RE123 crystals, crystals of RE123 are generated while maintaining the CuO-rich liquid phase, so plate-shaped crystals are produced more easily and a conductive layer comprised of $REBa_2Cu_3O_{7-\delta}$-based oxide having a more superior crystal orientation can probably be formed.

Figure 12:
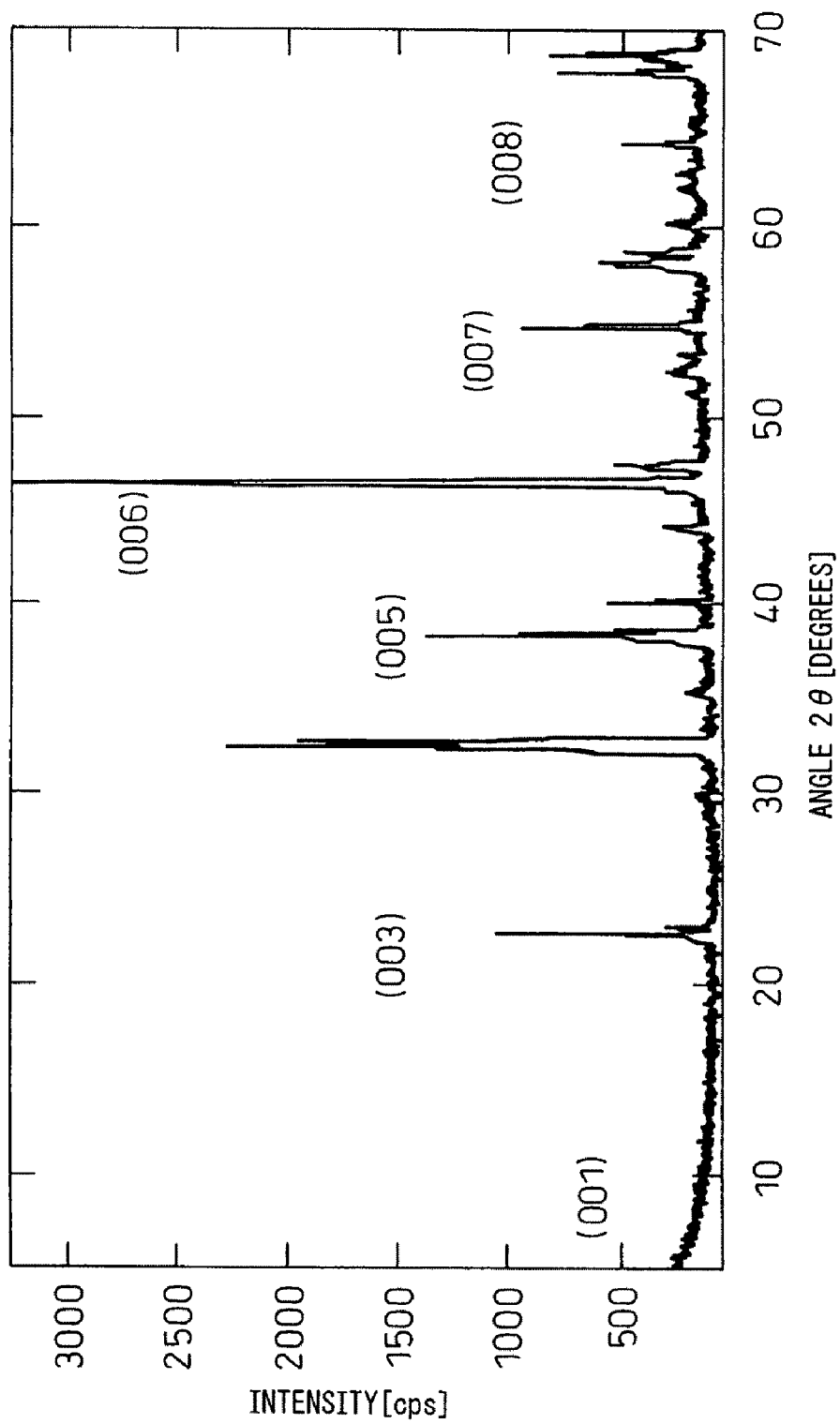
FIG. 12 is a view showing an X-ray diffraction intensity of a product obtained by filling a mixed powder material of a grain size of approximately 0.1 μm (obtained by mixing a 1 to 5 μm $Er_2BaO_4$ powder and the same $Ba_x$—$Cu_y$—$O_z$-based powder by a mixing ratio giving $ErBa_2Cu_3O_{7-\delta}$ and further adding 4 mass % of Ag using $Ag_2O$, then crushing for approximately 4 hours) in an Ag pipe, then drawing this to a plate thickness of 0.3 mm, heating in 1% $O_2$—Ar at 925° C. for 8 hours, then heating at 875° C. for 2 hours.

Here, FIG. 12 shows the X-ray diffraction intensity of REBa$_2$Cu$_3$O$_{7-\delta}$-based oxide produced by performing first heat treatment at 925° C. for 8 minutes and then performing second heat treatment at 875° C. for 2 hours. If compared with the X-ray diffraction intensity shown in FIG. 7, in FIG. 12, there is no peak showing the phase BaCuO$_2$ in the vicinity of 30 degrees and the (00L) strength of the 123 phase strongly appears. In addition, the strength peak without a certain plane index attached between (003) and (005) is the strength peak of (103) of the 123 phase.

That is, from a comparison of FIG. 7 and FIG. 12, it will be understood that when ending the first stage heat treatment, comprising heating the Ba$_x$—Cu$_y$—O$_z$-based material to a temperature (P temperature) of the dissolution temperature (P$_1$ temperature) of the material to form the liquid phase, in a short time where the liquid phase composition does not change, then suitably performing the second stage heat treatment at a temperature lower than the P temperature for several hours to grow the RE123 crystals, crystals of REBa$_2$Cu$_3$O$_{7-\delta}$-based oxide having a superior c-axis orientation are produced.

Note that when performing the first stage heat treatment at 925° C. for 8 minutes, then performing the second heat treatment at 850° C. or 825° C. for 2 hours, it was learned that the peak strength of other than (00L) showing the c-axis orientation increases and the c-axis orientation remarkably falls. This suggests that the second stage of the heat treatment temperature is preferably set at a temperature relatively near the first heat treatment.

The technical findings described in paragraphs [0136] to [0147] are findings newly discovered by the inventors and findings forming the basis of the present invention.

Further, the RE123-based oxide superconductor produced by the method of production of the superconductor of the present invention may be pressurized by an isotropic pressure of 10 MPa or more, then heat treated. This treatment is desirable in the point of making the crystals denser.

Further, the RE123-based oxide superconductor produced by the method of production of the superconductor of the present invention may be heat treated under an isotropic pressure of 0.5 MPa or more. This heat treatment is also preferable in the point of making the crystals denser.

Further, the RE123-based oxide superconductor produced by the method of production of the superconductor of the present invention is treated to add oxygen at 300 to 700° C. in the same way as a usual RE123-based oxide superconductor. By this oxygen addition treatment, an RE123-based oxide superconductor having more superior superconducting characteristics can be obtained.

EXAMPLES

Below, examples of the present invention will be explained, but the conditions employed in the examples are only examples of the conditions employed for demonstrating the workability or reproducibility of the present invention. The present invention is not limited to this example of conditions.

The present invention can employ various conditions so long as not deviating from the gist of the present invention and achieving the object of the present invention.

Example 1

Mixed materials of a grain size of approximately 0.05 μm (obtained by mixing 1 to 5 μm Er$_2$BaO$_4$ powder and a Ba$_x$—Cu$_y$—O$_z$-based material [BaCuO$_2$+CuO] by a mixing ratio giving ErBa$_2$Cu$_3$O$_{7-\delta}$, further adding 2 mass % of Ag using Ag$_2$O, then crushing for 10 hours) was deposited on an Ag substrate and heated in an argon atmosphere containing 1% oxygen at 900° C. for 3 hours to form an ErBa$_2$Cu$_3$O$_{7-\delta}$ superconductor.

By measurement of the X-ray diffraction strength of the obtained ErBa$_2$Cu$_3$O$_{7-\delta}$ superconductor and observation of the crystal surface by a scanning electron microscope (SEM), it could be confirmed that the entire surface of the Ag substrate was stably formed with an ErBa$_2$Cu$_3$O$_{7-\delta}$ superconductor having a superior crystal orientation at a low temperature.

This shows that by making the grain size of the mixed materials less than 1 μm, crystal orientation at a low temperature is sufficiently possible.

Further, the obtained ErBa$_2$Cu$_3$O$_{7-\delta}$ superconductor was treated to add oxygen in a stream of oxygen from 600° C. to 400° C. over 200 hours, then was evaluated for superconducting characteristics by a superconducting quantum interference device (SQUID). As a result, the onset T$_c$ was approximately 90K and the critical current density at 77K was 2.0× 10$^4$ A/cm$^2$ or more.

Example 2

Mixed materials similar to the mixed materials used in Example 1 were uniaxially formed into 6 mm pellet shapes. These were packed into an Ag tube of an inside diameter of 6 mm and outside diameter of 10 mm. This was then drawn and worked into a strip-shaped wire of a width of 3 mm and a thickness of 1 mm.

After this, the above strip-shaped wire was heat treated in the atmosphere at 920° C., then a wire sample of a 100 mm length was cut from the wire and slow cooled in an oxygen stream from 700° C. to 400° C. over for 200 hours to introduce oxygen.

The critical current characteristic of the wire sample was measured by the four-terminal method, whereupon the critical current density was 880 A/cm$^2$.

Example 3

Mixed materials of a grain size of approximately 0.1 μm (obtained by mixing 1 to 5 μm Er$_2$BaO$_4$ powder and a Ba$_x$—Cu$_y$—O$_z$-based material [BaCuO$_2$+CuO] by a mixing ratio giving ErBa$_2$Cu$_3$O$_{7-\delta}$, further adding 4 mass % of Ag using Ag$_2$O, then crushing for 4 hours) were packed into an Ag pipe of an inside diameter of 12 mm and outside diameter of 20 mm. This was drawn to a plate thickness of 0.3 mm to obtain a flat plate-shaped Ag sheath wire material.

The above material was heated in an argon atmosphere containing 1% oxygen at 925° C. for 8 minutes, then heat treated at (a) 875° C., (b) 850° C., (c) 825° C., and (d) 800° C. for 2 hours to form ErBa$_2$Cu$_3$O$_{7-\delta}$.

By measurement of the X-ray diffraction strength of the obtained ErBa$_2$Cu$_3$O$_{7-\delta}$ and observation of the crystal surface by a scanning electron microscope (SEM), it could be confirmed that when performing heat treatment at 925° C. for 8 minutes, then heat treating at (a) 875° C. for 2 hours, it was confirmed that ErBa$_2$Cu$_3$O$_{7-\delta}$ superior in c-axis orientation and having a plate-shaped structure is formed.

Figure 13:
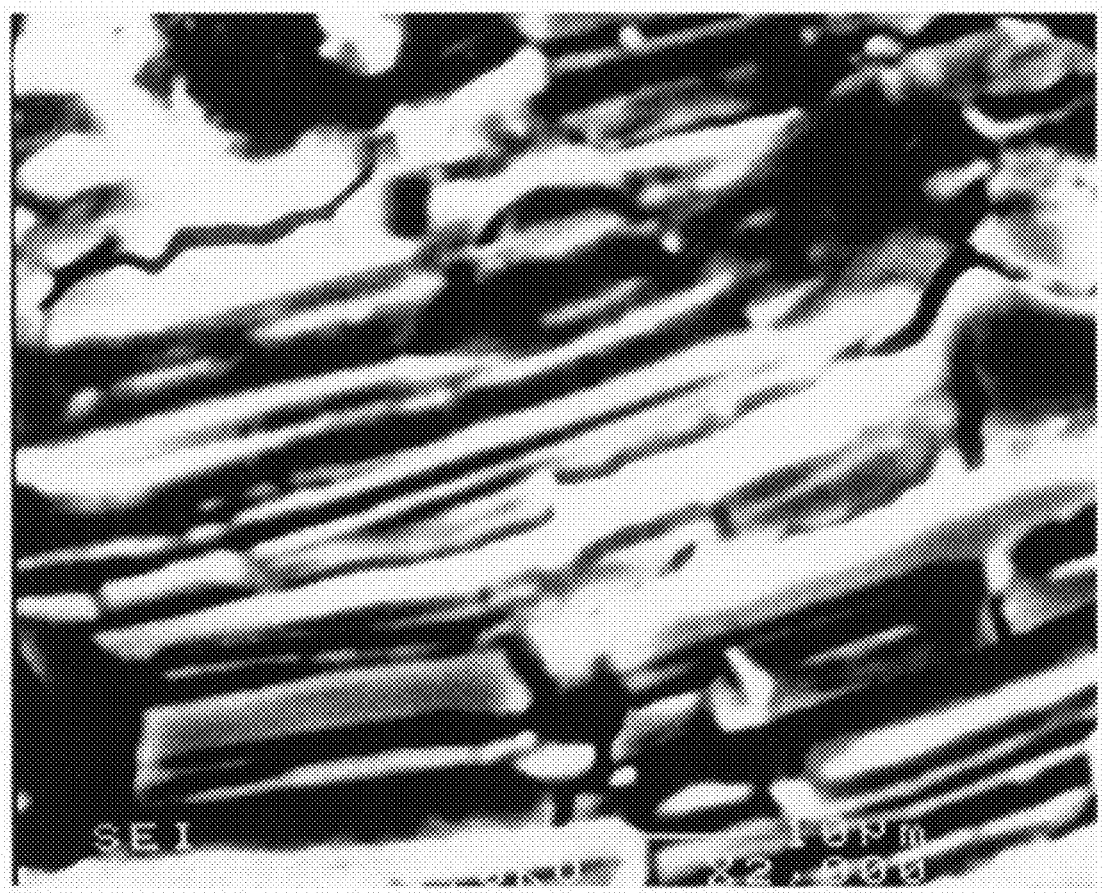
FIG. 13 is a view showing the microstructure of a cross-section of the above product.

Here, the results of measurement of the X-ray diffraction strength are shown in FIG. 12, while the image observed by the scanning electron microscope is shown in FIG. 13.

From FIG. 12, it is understood that the produced REBa$_2$Cu$_3$O$_{7-\delta}$-based oxide is superior in c-axis orientation, while from FIG. 13, it is understood that plate-shaped RE123 crystals are produced.

This shows that if applying two or more stages of heat treatment to the mixed materials at different temperatures, the RE123 crystals produced easily become plate shaped and the c-axis orientation is improved.

Further, the obtained $ErBa_2Cu_3O_{7-\delta}$ Ag sheath wire material was treated to add oxygen in an oxygen stream from 600° C. to 400° C. over 200 hours, then was evaluated for the temperature dependency of the magnetization by a superconducting quantum interference device (SQUID). As a result, the onset $T_c$ was 91 to 92K in all of the cases of heat treatment of the above (a) to (d) (in the figure, (a) to (d)).

Figure 14:
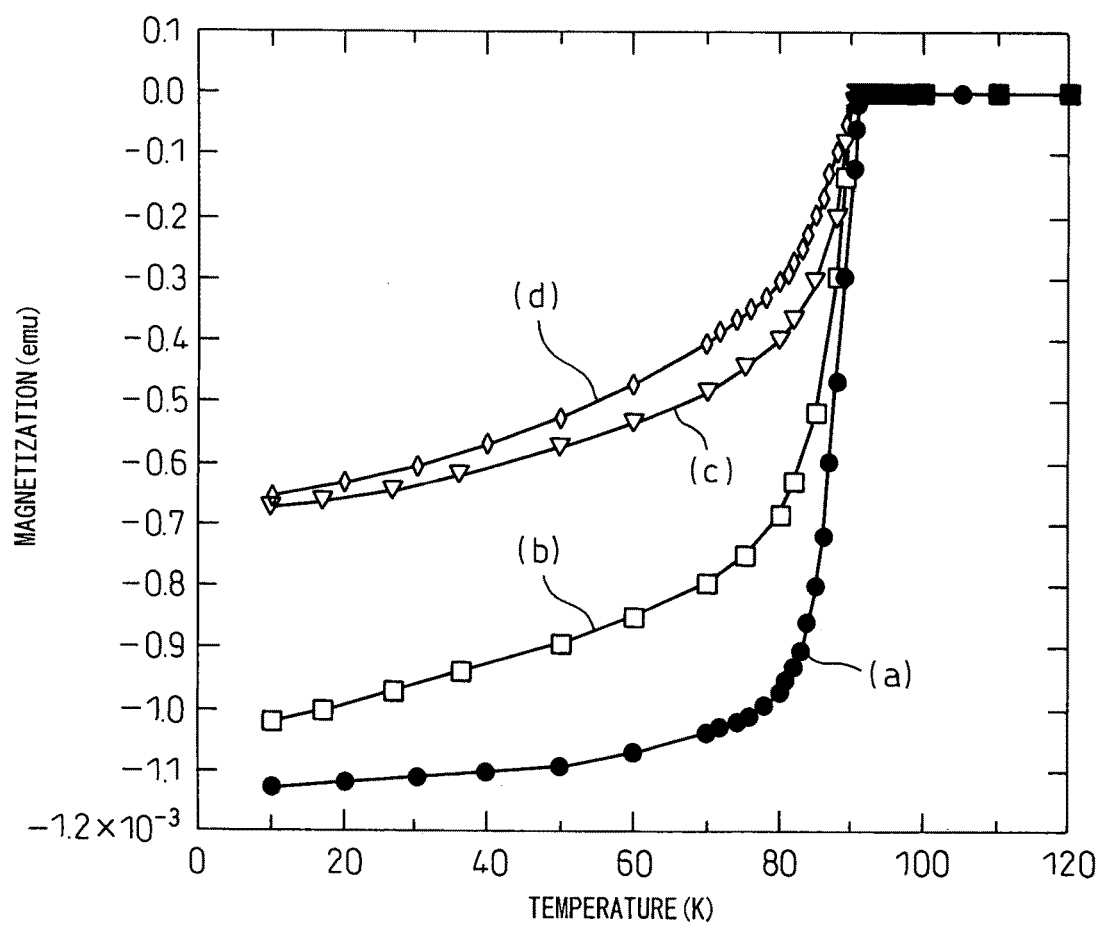
FIG. 14 is a view showing a temperature dependency of magnetization of a product obtained by filling a mixed powder material of a grain size of approximately 0.1 μm (obtained by mixing a 1 to 5 μm $Er_2BaO_4$ powder and the same $Ba_x$—$Cu_y$—$O_z$-based powder by a mixing ratio giving $ErBa_2Cu_3O_{7-\delta}$ and further adding 4 mass % of Ag using $Ag_2O$, then crushing for approximately 4 hours in an Ag pipe, then drawing this to a plate thickness of 0.3 mm, heating in 1% $O_2$—Ar at 925° C. for 8 hours, then heating at four types of temperatures for 2 hours. (a) 875° C., (b) 850° C., (c) 825° C., and (d) 800° C.
Figure 15:
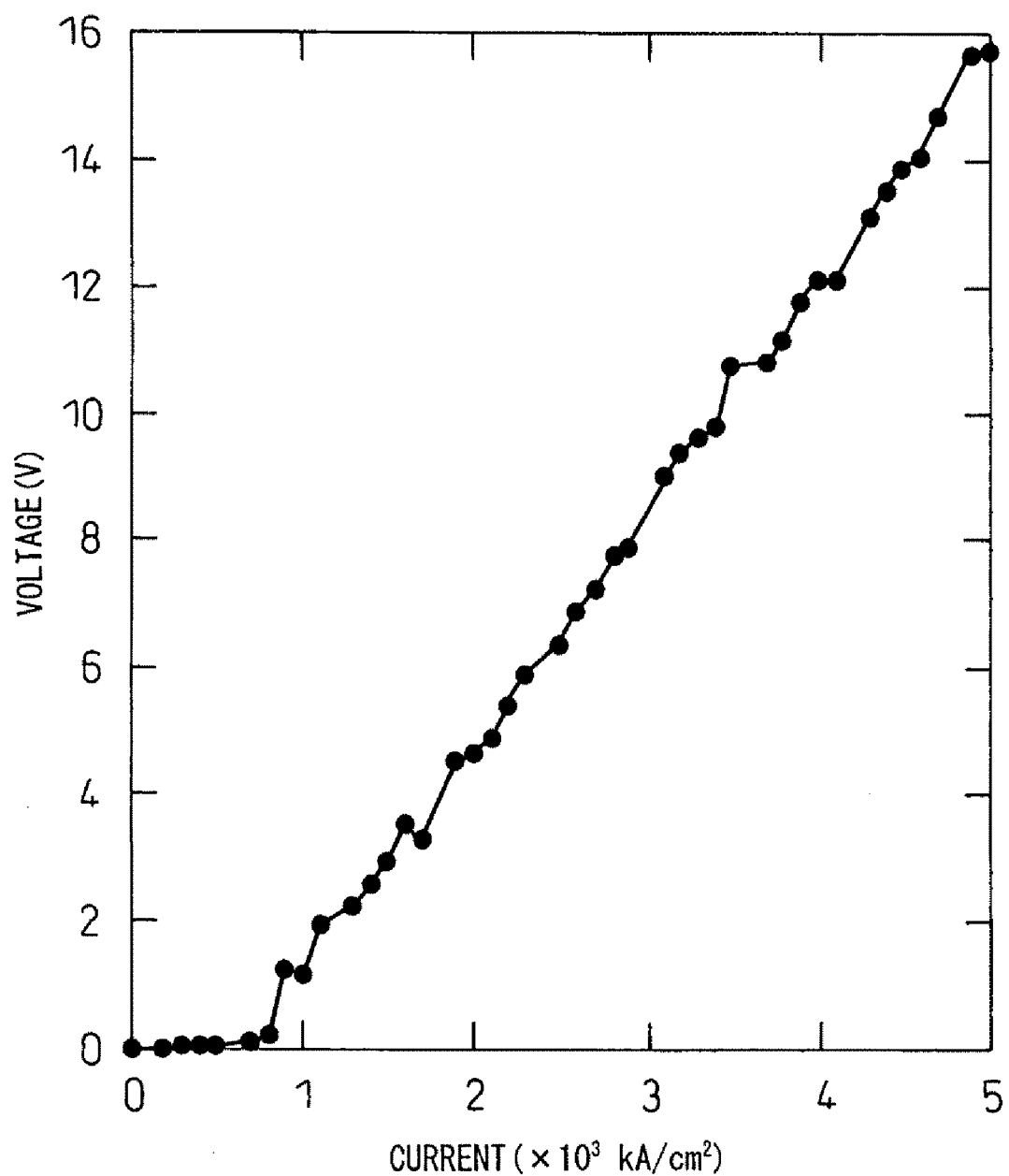
FIG. 15 is a view showing the current-voltage characteristics of the product shown in FIG. 12.

However, the higher the second stage heating temperature, the sharper the superconducting transition curve becomes and the better the superconducting characteristics obtained. This is shown in FIG. 14. Further, the Ag sheath wire material of (a), where the superconducting transition appears sharpest, was measured for the critical current density at 77K by the method of measurement of the critical current density using the third higher harmonic wave of the derivation method, whereupon an extremely high critical current density of $70 \times 10^4$ A/cm$^2$ or more was obtained. This is shown in FIG. 15.

INDUSTRIAL APPLICABILITY

As explained above, according to the present invention, it is possible to provide a long RE123-based oxide superconductor stably provided with superior superconducting characteristics and able to be used as a strand of a single core or multi-core wire. Consequently, the present invention can be widely utilized for strong magnetic field generating apparatuses, high voltage transmission, and resource and energy saving.

The invention claimed is:

1. A method of production of an RE123-based oxide superconductor which comprises (a) bringing part of a mixed material in which at least $RE_2BaO_4$ and a $Ba_x$—$Cu_y$—$O_z$-based material are mixed into contact with a holding member, then (b) drawing this one time or more, then (c) heating this in an atmosphere containing oxygen together with the holding member to a temperature of the dissolution temperature of the $Ba_x$—$Cu_y$-$O_z$-based material or more to form a conductive layer containing an $REBa_2Cu_3O_{7-\delta}$-based oxide superconductor, where, RE is one type or more of elements selected from La, Nd, Sm, Eu, Gd, Dy, Ho, Er, Tm, Yb, Lu, and Y.

2. A method of production of an RE123-based oxide superconductor according to claim 1 which comprises repeating the treatments of (b) and (c) to form a conductive layer containing an $REBa_2Cu_3O_{7-\delta}$-based oxide superconductor having a more superior crystal orientation.

3. A method of production of an RE123-based oxide superconductor which comprises (a) bringing part of a mixed material in which at least $RE_2BaO_4$ and a $Ba_x$—$Cu_y$-$O_z$-based material are mixed into contact with a holding member, then (b) heating this in an atmosphere containing oxygen together with the holding member to a temperature of the dissolution temperature of the $Ba_x$—$Cu_y$-$O_z$-based material or more and drawing this one time or more to form a conductive layer containing an $REBa_2Cu_3O_{7-\delta}$-based oxide superconductor, where, RE is one type or more of elements selected from La, Nd, Sm, Eu, Gd, Dy, Ho, Er, Tm, Yb, Lu, and Y.

4. A method of production of an RE123-based oxide superconductor according to any one of claim 1 or 3 which comprises pressurizing said RE123-based oxide superconductor at an isotropic pressure of 10 MPa or more, then heat treating it.

5. A method of production of an RE123-based oxide superconductor according to claim 3 which comprises repeating (b) to form a conductive layer containing an $REBa_2Cu_3O_{7-\delta}$-based oxide superconductor having a more superior crystal orientation.

6. A method of production of an RE123-based oxide superconductor according to any one of claim 1 or 3 which comprises pressurizing said RE123-based oxide superconductor at an isotropic pressure of 0.5 MPa or more.

* * * * *